United States Patent
Inoue

(10) Patent No.: US 10,418,930 B2
(45) Date of Patent: Sep. 17, 2019

(54) SOLAR PANEL UNIT AND SOLAR POWER GENERATION APPARATUS

(71) Applicant: Panasonic Intellectual Property Management Co., Ltd., Osaka (JP)

(72) Inventor: Kazuo Inoue, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 841 days.

(21) Appl. No.: 14/743,750

(22) Filed: Jun. 18, 2015

(65) Prior Publication Data

US 2016/0020723 A1 Jan. 21, 2016

(30) Foreign Application Priority Data

Jul. 15, 2014 (JP) .................. 2014-144912

(51) Int. Cl.
*H02S 20/10* (2014.01)
*H02S 20/20* (2014.01)
(Continued)

(52) U.S. Cl.
CPC .............. *H02S 20/10* (2014.12); *H02S 10/12* (2014.12); *H02S 20/00* (2013.01); *H02S 20/20* (2014.12); *H02S 20/21* (2014.12); *H02S 20/30* (2014.12); *H02S 20/32* (2014.12); *H02S 30/10* (2014.12); *H02S 30/20* (2014.12); *H01L 31/05* (2013.01);
(Continued)

(58) Field of Classification Search
CPC .......... H02S 20/10; H02S 20/30; H02S 20/00; H02S 10/12; H02S 30/20; H02S 20/32; H02S 30/10; H02S 20/21; H02S 20/20; H02S 10/10; H02S 10/20; Y02E 10/52; Y02E 10/47; F24J 2/5209; F24J 2/5203; F24J 2/4638; F24J 2/38; F24J 2/5232; F24J 2002/4665; H01L 31/05
See application file for complete search history.

(56) References Cited

U.S. PATENT DOCUMENTS 6,483,093 B1 * 11/2002 Takemura ................ F24J 2/085
250/203.4
9,324,893 B1 * 4/2016 Kats ...................... H02J 7/0052
(Continued)

FOREIGN PATENT DOCUMENTS

JP 60-169173 9/1985
JP 8-134851 5/1996
(Continued)

OTHER PUBLICATIONS

Catalog "light-collecting type solar power generation system", Nov. 2011, issued by Daido Steel Co., Ltd.

*Primary Examiner* — Magali P Slawski
*Assistant Examiner* — Michael Y Sun
(74) *Attorney, Agent, or Firm* — Wenderoth, Lind & Ponack, L.L.P.

(57) ABSTRACT

A second panel and a third panel are disposed on both sides of a first panel in the width direction, a fourth panel is disposed at a position symmetrical with the first panel with respect to the second panel and third panel, the respective panels have the same length and are disposed parallel to each other, and a step is provided with a gap between the first panel and the second panel or the third panel, and between the fourth panel and the second panel or the third panel.

12 Claims, 17 Drawing Sheets

(51) Int. Cl.
  *H02S 20/21* (2014.01)
  *H02S 20/32* (2014.01)
  *H02S 30/10* (2014.01)
  *H02S 30/20* (2014.01)
  *H02S 20/00* (2014.01)
  *H02S 10/12* (2014.01)
  *H02S 20/30* (2014.01)
  *H02S 10/20* (2014.01)
  *H02S 10/10* (2014.01)
  *H01L 31/05* (2014.01)

(52) U.S. Cl.
  CPC ............... *H02S 10/10* (2014.12); *H02S 10/20* (2014.12); *Y02E 10/52* (2013.01)

(56) References Cited

U.S. PATENT DOCUMENTS

| | | | | |
|---|---|---|---|---|
| 2005/0166955 | A1* | 8/2005 | Nath | F24J 2/5205 136/251 |
| 2010/0126554 | A1* | 5/2010 | Morgan | H02S 20/00 136/246 |
| 2011/0056540 | A1 | 3/2011 | Edgar | |
| 2011/0146751 | A1* | 6/2011 | McGuire | F03D 9/007 136/245 |
| 2011/0165441 | A1* | 7/2011 | Genies | H02J 7/355 429/9 |
| 2013/0008431 | A1* | 1/2013 | Fitch | F24J 2/4638 126/601 |
| 2014/0209146 | A1* | 7/2014 | Park | F24J 2/38 136/246 |
| 2014/0326294 | A1 | 11/2014 | Inoue | |

FOREIGN PATENT DOCUMENTS

| | | | |
|---|---|---|---|
| JP | 2001-223380 | 8/2001 | |
| WO | 2010/018294 | 2/2010 | |
| WO | WO 2013032099 A1 * | 3/2013 | ............... F24J 2/38 |
| WO | 2014/064861 | 5/2014 | |

* cited by examiner

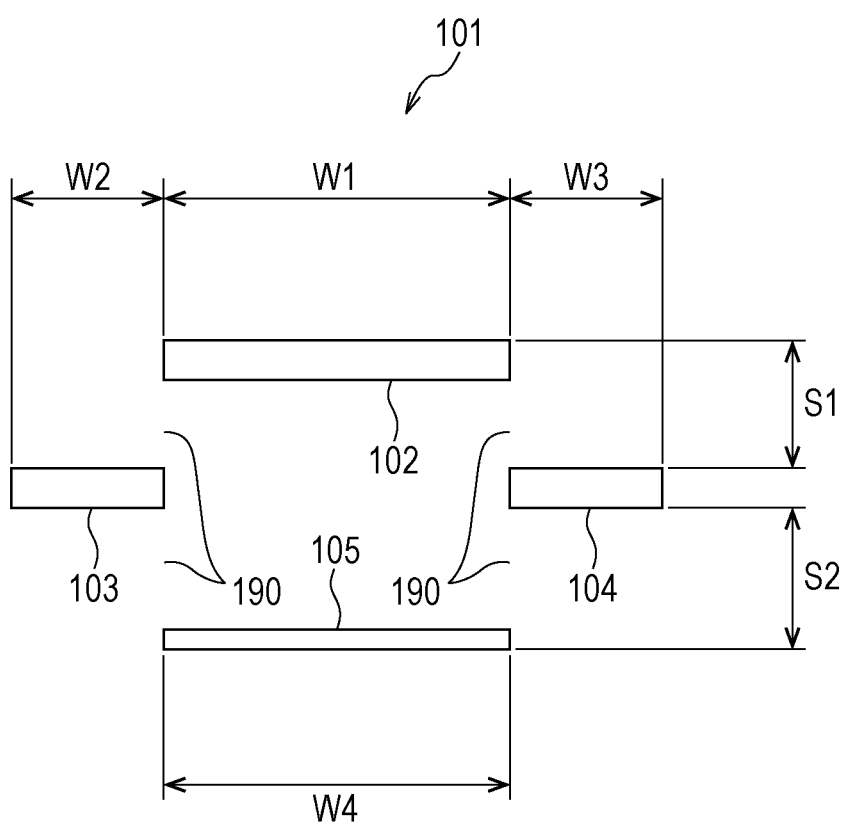

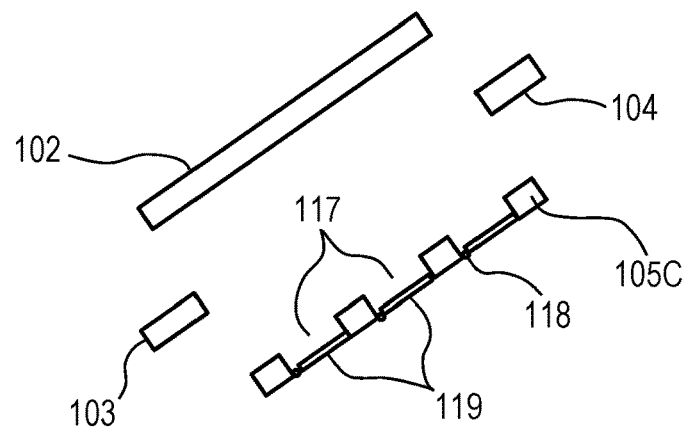
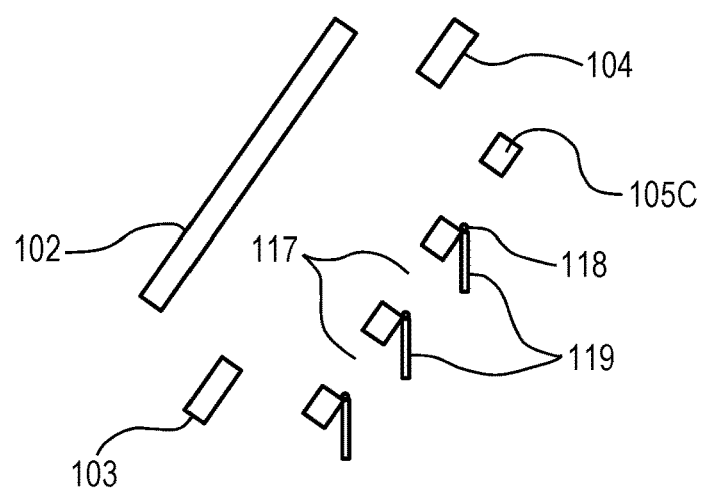

SOLAR PANEL UNIT AND SOLAR POWER GENERATION APPARATUS

BACKGROUND

1. Technical Field

The present disclosure relates to a solar panel unit and a solar power generation apparatus on which a module which converts solar light energy into electrical energy is mounted, and more particularly to a solar panel unit and a solar power generation apparatus where an influence of wind exerted on the unit or the apparatus can be reduced.

2. Description of the Related Art

Conventionally, there has been known a solar panel unit having the two-stage structure consisting of three panels in total as shown in FIG. 19 where panels 91 are disposed on both sides of center panel 90 and below a center panel 90 with gaps therebetween (see Catalog "light-collecting type solar power generation system", November, 2011, issued by Daido Steel Co., Ltd.

However, the conventional solar panel unit having the two-stage structure is required to satisfy the further reduction of a wind load.

SUMMARY OF THE INVENTION

One non-limiting and exemplary embodiment provides a solar panel unit where a wind load received by a solar panel can be further reduced.

Additional benefits and advantages of one mode of this disclosure will become apparent from this specification and drawings. The benefits and/or advantages may be individually provided by the various embodiments and features of the specification and drawings, and need not all be provided in order to obtain one or more of the same.

In one general aspect, the techniques disclosed here feature a solar panel unit including:

a first panel provided with a module having a photovoltaic element on a front surface of the first panel;

a second panel provided with a module having a photovoltaic element on a front surface of the second panel, the second panel disposed on one side of the first panel in a width direction, the second panel disposed at a position behind the first panel in a direction orthogonal to the front surface of the first panel with a predetermined distance therebetween as viewed from a front surface side of the first panel;

a third panel provided with a module having a photovoltaic element on a front surface of the third panel, the third panel disposed on the other side of the first panel opposite to one side of the first panel in the width direction, the third panel disposed at a position behind the first panel in the direction orthogonal to the front surface of the second panel with a predetermined distance therebetween as viewed from the front surface side of the first panel; and a fourth panel disposed at a position symmetrical with the first panel in the direction orthogonal to the front surface of the first panel with respect to a plane on which the second panel and the third panel are present, wherein a length of the second panel is equal to a length of the first panel, and the front surface of the second panel is parallel to the front surface of the first panel, a length of the third panel is equal to the length of the first panel, a width of the third panel is equal to a width of the second panel, and the front surface of the third panel is parallel to the front surface of the first panel, and the fourth panel is not provided with a module having a photovoltaic element on a front surface of the fourth panel, a length of the fourth panel is equal to the length of the first panel, a width of the fourth panel is equal to the width of the first panel, and the front surface of the fourth panel is parallel to the front surface of the first panel.

A comprehensive or specific mode may be realized in the form of an apparatus or may be realized in the form of the combination of a unit and an apparatus.

According to this disclosure, even when a wind blows to the solar panel unit from any side including the front side and the rear side of the unit, a wind load received by the panel can be reduced.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

It should be noted that general or specific embodiments may be implemented as a system, a method, an integrated circuit, a computer program, a storage medium, or any selective combination thereof.

BRIEF DESCRIPTION OF THE DRAWINGS

FIG. 4 is a cross-sectional view of the solar panel unit of the first exemplary embodiment of this disclosure shown in FIG. 1 taken along a horizontal plane in a state where panels are erected in the vertical direction;

FIG. 13C is an explanatory view for describing the fourth panel of the solar panel unit of the third exemplary embodiment in a state where the fourth panel is disposed on a leeward side, a wind incident angle is 45 degrees or less, and respective lid plates of the fourth panel close the through holes;

FIG. 13D is an explanatory view for describing the fourth panel of the solar panel unit of the third exemplary embodiment in a state where the fourth panel is disposed on a leeward side, a wind incident angle is 45 degrees or more, and respective lid plates of the fourth panel are opened so that a wind passes through the through holes;

DETAILED DESCRIPTION OF THE INVENTION

Figure 1:
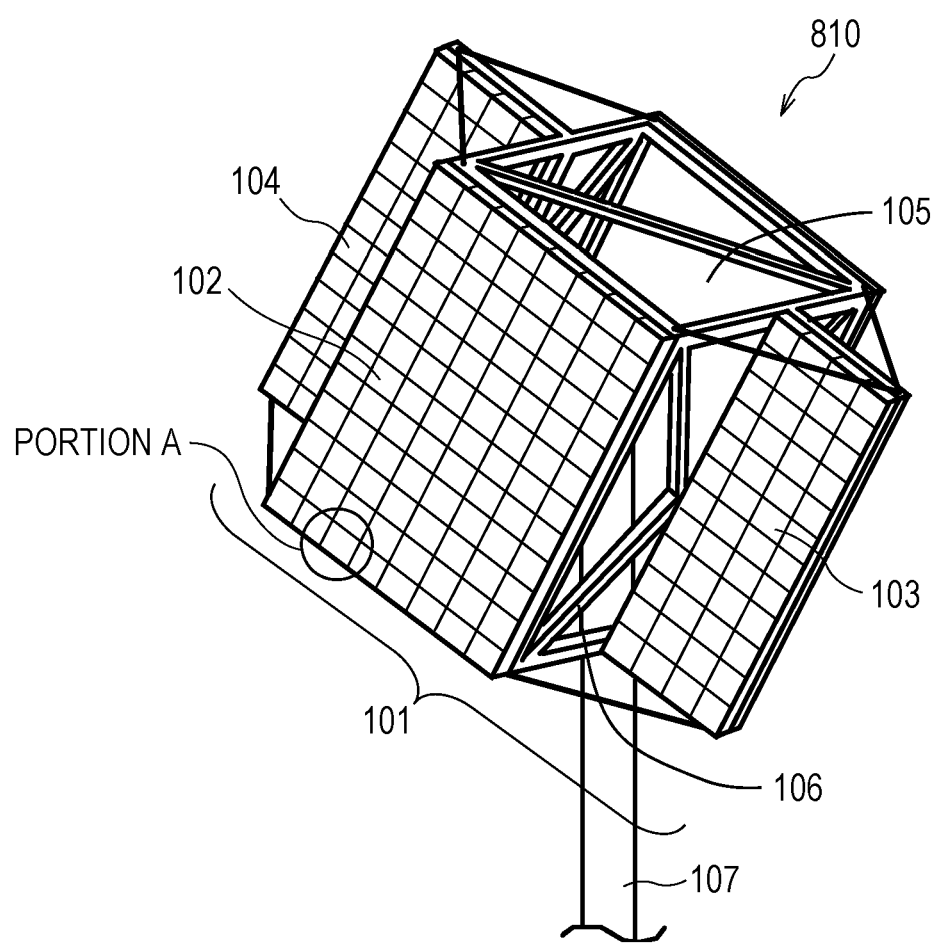
FIG. 1 is a perspective view showing a solar power generation apparatus of a first exemplary embodiment of this disclosure.

Hereinafter, prior to the detailed description of exemplary embodiments of this disclosure by reference to drawings, the aspects of this disclosure are described.

According to a first aspect of this disclosure, there is provided a solar panel unit including:

a first panel provided with a module having a photovoltaic element on a front surface of the first panel;

a second panel provided with a module having a photovoltaic element on a front surface of the second panel, the second panel disposed on one side of the first panel in a width direction, the second panel disposed at a position behind the first panel in a direction orthogonal to the front surface of the first panel with a predetermined distance therebetween as viewed from a front surface side of the first panel;

a third panel provided with a module having a photovoltaic element on a front surface of the third panel, the third panel disposed on the other side of the first panel opposite to one side of the first panel in the width direction, the third panel disposed at a position behind the first panel in the direction orthogonal to the front surface of the second panel with a predetermined distance therebetween as viewed from the front surface side of the first panel; and a fourth panel disposed at a position symmetrical with the first panel in the direction orthogonal to the front surface of the first panel with respect to a plane on which the second panel and the third panel are present, wherein a length of the second panel is equal to a length of the first panel, and the front surface of the second panel is parallel to the front surface of the first panel, a length of the third panel is equal to the length of the first panel, a width of the third panel is equal to a width of the second panel, and the front surface of the third panel is parallel to the front surface of the first panel, and the fourth panel is not provided with a module having a photovoltaic element on a front surface of the fourth panel, a length of the fourth panel is equal to the length of the first panel, a width of the fourth panel is equal to the width of the first panel, and the front surface of the fourth panel is parallel to the front surface of the first panel.

According to the above-mentioned aspect, even when a wind blows to the solar panel unit from whichever side of the unit, that is, a front side or a rear side of the unit, a wind load received by the panel can be further reduced.

According to a second aspect of this disclosure, in the solar panel unit described in the first aspect, assuming a ratio of the width of the first panel to a total panel unit width which is a sum of the width of the first panel, the width of the second panel and the width of the third panel as W, and assuming a ratio of a step formed between the front surface of the first panel and the front surface of the second panel to the total panel unit width and a ratio of a step formed between the front surface of the second panel and the front surface of the fourth panel to the total panel unit width as S, the following relationship is established.

$0.90$-$1.00W \leq S$ at $0.30 \leq W \leq 0.40$
$1.02$-$1.30W \leq S$ at $0.40 \leq W \leq 0.63$
$0.52$-$0.50W \leq S$ at $0.63 \leq W \leq 0.73$
$0.15 \leq S$ at $0.73 \leq W \leq 0.90$ According to the above-mentioned aspect, even when a wind blows to the solar panel unit from whichever side of the unit, that is, a front side or a rear side of the unit, a wind load received by the panel can be reduced with more certainty (for example, a wind load can be reduced to 240 N or less).

According to a third aspect of this disclosure, in the solar panel unit described in the first or second aspect, assuming a ratio of the width of the first panel to a total panel unit width which is a sum of the width of the first panel, the width of the second panel and the width of the third panel as IN, and assuming a ratio of a step formed between the front surface of the first panel and the front surface of the second panel to the total panel unit width and a ratio of a step formed between the front surface of the second panel and the front surface of the fourth panel to the total panel unit width as S, the following relationship is established.

$0.73$-$0.77W \leq S$ at $0.33 \leq W \leq 0.43$
$1.48$-$2.50W \leq S$ at $0.43 \leq W \leq 0.47$
$0.82$-$1.11W \leq S$ at $0.47 \leq W \leq 0.56$
$0.66$-$0.83W \leq S$ at $0.56 \leq W \leq 0.62$
$0.15 \leq S$ at $0.62 \leq W \leq 0.85$ and $S \leq 0.53$ at $0.33 \leq W \leq 0.46$
$S \leq 1.34$-$1.75W$ at $0.46 \leq W \leq 0.50$
$S \leq 0.91$-$0.90W$ at $0.50 \leq W \leq 0.60$
$S \leq 0.69$-$0.56W$ at $0.60 \leq W \leq 0.76$
$S \leq 1.02$-$1.00W$ at $0.76 \leq W \leq 0.84$
$S \leq 2.70$-$3.00W$ at $0.84 \leq W \leq 0.85$ According to the above-mentioned aspect, even when a wind blows to the solar panel unit from whichever side of the unit, that is, a front side or a rear side of the unit, a wind load received by the panel can be reduced with more certainty (for example, a wind load can be reduced to 270 N or less).

According to a fourth aspect of this disclosure, in the solar panel unit described in the first aspect, the fourth panel has: a through hole; a lid capable of opening or closing the through hole; and an opening/closing mechanism for opening or closing the lid.

According to the above-mentioned aspect, when a wind blows from a side where the lid is mounted, the through hole is closed by the lid and hence, a wind from the oblique direction can be made to flow also along a surface of the fourth panel. Further, when the fourth panel receives a wind pressure, the lid is opened by a wind pressure and a wind passes through the through hole so that a wind load can be reduced.

According to a fifth aspect of this disclosure, in the solar panel unit described in the fourth aspect, assuming a ratio of the width of the first panel to a total panel unit width which is a sum of the width of the first panel, the width of the second panel and the width of the third panel as W, and assuming a ratio of a step formed between the front surface of the first panel and the front surface of the second panel to the total panel unit width and a ratio of a step formed between the front surface of the second panel and the front surface of the fourth panel to the total panel unit width as S, the following relationship is established.

$0.68$-$0.70W \leq S$ at $0.30 \leq W \leq 0.40$
$0.97$-$1.43W$ at $0.40 \leq W \leq 0.47$
$0.89$-$1.25W \leq S$ at $0.47 \leq W \leq 0.55$
$0.66$-$0.83W \leq S$ at $0.55 \leq W \leq 0.61$
$0.15 \leq S$ at $0.61 \leq W \leq 0.80$
$-0.65 + 1.00W \leq S$ at $0.80 \leq W \leq 0.85$ and $S \leq 0.60$ at $0.30 \leq W \leq 0.38$
$S \leq 0.77$-$0.45W$ at $0.38 \leq W \leq 0.60$
$S \leq 1.10$-$1.00W$ at $0.60 \leq W \leq 0.64$
$S \leq 2.59$-$3.33W$ at $0.64 \leq W \leq 0.67$
$S \leq 0.96$-$0.89W$ at $0.67 \leq W \leq 0.85$ According to the above-mentioned aspect, even when a wind blows to the solar panel unit from any side of the unit, a wind load received by the panel can be reduced with more certainty (for example, a wind load can be reduced to 270 N or less).

According to a sixth aspect of this disclosure, in the solar panel unit described in the fourth aspect, the fourth panel is configured such that an outer surface of the lid is disposed on the same plane as an outer surface of the fourth panel in a state where the lid closes the through hole.

According to the above-mentioned aspect, it is possible to suppress a phenomenon that the flow of wind is disturbed at a boundary between the fourth panel and the lid, thus increasing a wind load.

According to a seventh aspect of this disclosure, in the solar panel unit described in the fourth aspect, the fourth panel is configured such that the lid is positioned parallel to the wind direction in a state where the lid opens the through hole.

According to the above-mentioned aspect, it is possible to suppress a phenomenon that the flow of wind impinges on the lid of the fourth panel, thus increasing a wind load.

According to an eighth aspect of this disclosure, in the solar panel unit described in any one of the first to seventh aspects, a thickness of the fourth panel is set smaller than thicknesses of the first panel, the second panel and the third panel, and a weight of the fourth panel is set smaller than a weight of the first panel.

According to the above-mentioned aspect, by reducing a weight of the fourth panel, a weight of the solar panel unit as a whole is reduced and hence, an output from a drive motor can be reduced. Accordingly, a power consumption of the drive motor can be reduced.

According to a ninth aspect of this disclosure, in the solar panel unit described in any one of the first to eighth aspects, the module further includes a light-collecting optical member which collects sun light on the photovoltaic element.

According to the above-mentioned aspect, electricity generation efficiency of the solar panel unit per unit area is increased and hence, an area necessary for acquiring the same electric power can be reduced. Accordingly, the solar panel unit can be miniaturized and light-weighted.

According to a tenth aspect of this disclosure, in the solar panel unit described in any one of the first to ninth aspects, the fourth panel has a cutaway portion into or out of which a support strut supporting the first to fourth panels goes.

According to the above-mentioned aspect, the support strut can go into or go out from the cutaway portion, thus preventing the interference between the support strut and the fourth panel.

According to an eleventh aspect of this disclosure, there is provided a solar power generation apparatus including:
the solar panel unit described in any one of the first to tenth aspects;
a support strut that supports all panels; and
a two-axis rotation mechanism which is disposed between the support strut and the panel, and moves the solar panel unit in an elevation angle direction and in an azimuth direction independently from each other, and
a center of gravity of the solar panel unit and a center of a rotation axis of the two-axis rotation mechanism agree with each other.

According to the above-mentioned aspect, a torque required for driving the solar panel unit is reduced and hence, an output from the drive motor can be reduced. Accordingly, a power consumption of the drive motor can be reduced.

According to a twelfth aspect of this disclosure, in the soar power generation apparatus described in the eleventh aspect, the two-axis rotation mechanism is provided in a region surrounded by four panels constituting the solar panel unit.

According to the eleventh and twelfth aspects, it is possible to prevent a phenomenon that wind impinges on the two-axis rotation mechanism, thus increasing a wind load.

According to a thirteenth aspect of this disclosure, there is provided a solar power generation apparatus including:
the solar panel unit described in the fifth aspect;
an anemometer; and
a calculator which calculates a direction of a panel, wherein an intersecting angle between a wind direction and the panel is calculated based on detection values of the anemometer and the calculator, and
the opening/closing of the through hole formed in the fourth panel by the lid is adjusted in accordance with the intersecting angle when a wind speed measured by the anemometer is a threshold value or more.

According to the above-mentioned aspect, the adjustment of the opening/closing of the lid for the through hole formed in the fourth panel is performed such that when an intersecting angle of an acute angle made between the normal direction of the fourth panel and the wind direction is 45 degrees or more, the lid of the fourth panel is brought into an open state, while when the intersecting angle of an acute angle is an angle of degrees other than 45 degrees or more, the lid of the fourth panel is brought into a closed state.

According to a fourteenth aspect of this disclosure, in the solar power generation apparatus described in the thirteenth aspect, the lid of the fourth panel is brought into an open state when an intersecting angle between the normal direction of the fourth panel and the wind direction is an acute angle of 45 degrees or more, and the lid of the fourth panel is brought into a closed state when the intersecting angle is an acute angle of degrees other than 45 degrees or more.

According to the above-mentioned aspect, even when a wind blows to the solar panel unit from any side of the unit, a wind load received by the panel can be reduced.

According to a fifteenth aspect of this disclosure, in the solar power generation apparatus described in the thirteenth aspect, the lid of the fourth panel is brought into an open state when an intersecting angle between the normal direction of the fourth panel and the wind direction is an acute angle of 45 degrees or more and 75 degree or less, and the lid of the fourth panel is brought into a closed state when the intersecting angle is an acute angle of degree other than 45 degrees or more and 75 degree or less.

According to the above-mentioned aspect, even when a wind blows to the solar panel unit from any side of the unit, a wind load received by the panel can be reduced.

According to a sixteenth aspect of this disclosure, there is provided a solar panel unit including:
a first panel having a first surface, a second surface opposite to the first surface, and a first photovoltaic module that receives sun light through the first surface;
a second panel having a third surface, a fourth surface opposite to the third surface, and a second photovoltaic module that receives sun light through the third surface;
a third panel having a fifth surface, a sixth surface opposite to the fifth surface, and a third photovoltaic module that receives sun light through the fifth surface; and
a fourth panel having a seventh surface and an eighth surface opposite to the seventh surface, wherein
the fourth surface and the sixth surface are present on the same imaginary plane,
the second surface, the eighth surface and the imaginary plane are parallel to each other,
a first distance between the second surface and the imaginary plane is smaller than a second distance between the second surface and the eighth surface,
the second surface does not overlap with the fourth surface and the sixth surface when the second surface is moved vertically onto the imaginary plane without being moved horizontally,
the seventh surface does not overlap with the fourth surface and the sixth surface when the seventh surface is vertically moved onto the imaginary plane without being moved horizontally, a length of the first panel, a length of the second panel, a length of the third panel and a length of the fourth panel are equal, a width of the first panel and a width of the fourth panel are equal, a width of the second panel and a width of the third panel are equal, the first panel is directly connected to a connecting portion connected to a support portion, the second panel, the third panel and the fourth panel are not directly connected to the connecting portion, the first panel, the second panel, the third panel and the fourth panel are connected to each other, a thickness of the second panel and a thickness of the third panel are smaller than the first distance, a thickness of the fourth panel is smaller than a distance between the imaginary plane and the eighth surface, and gaps are formed between the first panel, the second panel, the third panel and the fourth panel respectively.

According to a seventeenth aspect of this disclosure, in the solar panel unit described in the sixteenth aspect, the fourth panel is not provided with a photovoltaic module.

Hereinafter, embodiments of this disclosure are described by reference to drawings.

First Exemplary Embodiment

FIG. 1 is a perspective view of solar power generation apparatus 810 on which solar panel unit 101 of a first exemplary embodiment of this disclosure is mounted.

In FIG. 1, numeral 101 indicates a solar panel unit. Solar panel unit 101 includes four panels consisting of first panel 102, second panel 103, third panel 104 and fourth panel 105.

First panel 102 is a plate-shaped panel having a quadrangular shape (a rectangular shape, for example) which is disposed at the center of solar panel unit 101. Second panel 103 is a plate-shaped panel having a quadrangular shape (a rectangular shape, for example) which is disposed adjacent to an outer side of one side portion of first panel 102 in the width direction. Third panel 104 is a plate-shaped panel having a quadrangular shape (a rectangular shape, for example) which is disposed adjacent to an outer side of the other side portion of first panel 102 in the width direction. Fourth panel 105 is a plate-shaped panel having a quadrangular shape (a rectangular shape, for example) which is disposed at a position symmetrical with the first panel with respect to the second panel and the third panel.

A module which generates electric power by sun light is mounted on first panel 102, second panel 103 and third panel 104 respectively. On the other hand, fourth panel 105 is disposed in a shade of first panel 102 so that a module which generates electric power is not mounted on fourth panel 105.

First panel 102, second panel 103, third panel 104 and fourth panel 105 have the same length and are parallel to each other. In this specification, however, "First panel 102, second panel 103, third panel 104 and fourth panel 105 have the same length" also includes the case where there is a difference in length among the panels to an extent that a manufacturing error is allowed, that is, a difference of 0.1% to 0.2% is allowed.

A width of fourth panel 105 is equal to a width of first panel 102. In this specification, "A width of fourth panel 105 is equal to a width of first panel 102" also includes the case where there is a difference in width between these panels to an extent that a manufacturing error is allowed, that is, a difference of 0.1% to 0.2% is allowed.

A width of second panel 103 is equal to a width of third panel 104. In this specification, "A width of second panel 103 is equal to a width of third panel 104" also includes the case where there is a difference in width between the panels to an extent that a manufacturing error is allowed, that is, a difference of 0.1% to 0.2% is allowed.

As an example, all of first panel 102, second panel 103, third panel 104 and fourth panel 105 may have the same thickness. Alternatively, all of first panel 102, second panel 103 and third panel 104 may have the same thickness, and fourth panel 105 may have a smaller thickness than other panels, that is, first panel 102, second panel 103 and third panel 104. Further, as an example, fourth panel 105 may have lighter weight than other panels, that is, first panel 102, second panel 103 and third panel 104.

Step S1 is provided between first panel 102 and second panel 103 as well as between first panel 102 and third panel 104 respectively with gap 190 therebetween in the direction orthogonal to front surfaces of the respective panels (see FIG. 4). That is, first panel 102, second panel 103 and third panel 104 are disposed in a state where, as viewed from a front surface side of first panel 102, second panel 103 and third panel 104 are displaced rearward from first panel 102 by one stage with gap 190 therebetween.

Step S2 is also provided between second panel 103 and fourth panel 105 as well as between third panel 104 and fourth panel 105 respectively with gap 190 therebetween in the direction orthogonal to the front surfaces of the respective panels. That is, fourth panel 105 is disposed at a position symmetrical with first panel 102 with respect to second panel 103 and third panel 104 in the direction orthogonal to the front surface of first panel 102. In other words, fourth panel 105 is disposed in a state where, as viewed from the front surface side of first panel 102, fourth panel 105 is displaced at a position behind second panel 103 and third panel 104 by one stage with gap 190 therebetween.

First panel 102, second panel 103, third panel 104 and fourth panel 105 are connected to each other by beams 106, and these panels move as an integral body. As described later, first panel 102 is rotatably supported on support strut 107 in a state that a back surface of first panel 102 is supported on support strut 107.

In the above-mentioned constitution, to prevent the lowering of efficiency of solar power generation, second panel 103 and third panel 104 are disposed so as not to overlap with first panel 102.

To suppress the deformation of beams 106, beams 106 adopt the truss structure where beams 106 form triangular shapes.

Accordingly, three panels consisting of first panel 102, second panel 103 and third panel 104 are disposed in a symmetrical shape formed by three panels in two stages with respect to a center axis of first panel 102 in the longitudinal direction and a center axis of first panel 102 in the width direction so that a wind load acts on the panels in a vertically symmetrical manner as well as in a laterally symmetrical manner with respect to the center axis of first panel 102. In a posture where the panels are rotated by 180 degrees from the above-mentioned posture, three panels consisting of fourth panel 105, second panel 103 and third panel 104 are disposed in a symmetrical shape formed by three panels in two stages with respect to a center axis of fourth panel 105 in the longitudinal direction and a center axis of fourth panel 105 in the width direction so that a wind bad acts on the panels in a vertically symmetrical manner as well as in a laterally symmetrical manner with respect to the center axis of fourth panel 105.

Figure 2A:
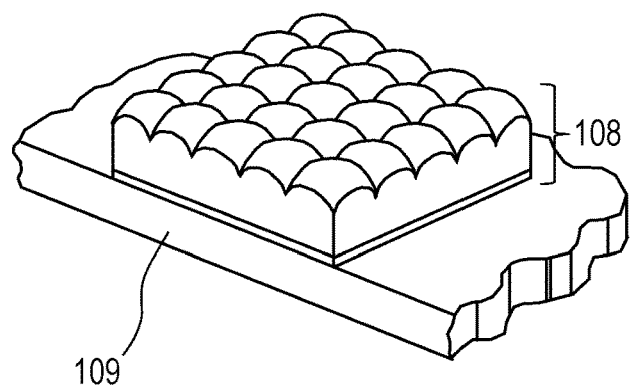
FIG. 2A is a perspective view showing a photovoltaic module part used in a solar panel unit of the first exemplary embodiment of this disclosure.
Figure 2B:
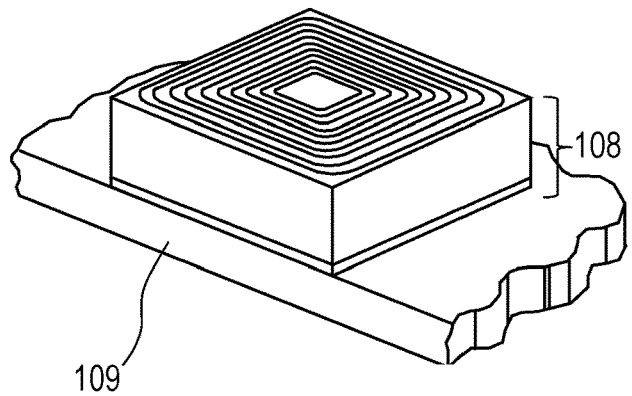
FIG. 2B is a perspective view showing the photovoltaic module part used in the solar panel unit of the first exemplary embodiment of this disclosure.

FIG. 2A and FIG. 2B show portion A which is a portion of first panel 102 in an enlarged manner. In FIG. 2A and FIG. 2B, numeral 108 indicates a photovoltaic module, and numeral 109 indicates a base plate which supports photovoltaic module 108. To facilitate the understanding of the structure shown in the drawings, one photovoltaic module 108 is shown in the drawings. In an actual apparatus, a plurality of photovoltaic modules 108 are mounted on base plate 109.

Photovoltaic module 108 is of a light-collecting type. As an example, photovoltaic module 108 has a square shape of 5 cm×5 cm, and has a thickness of 2 cm.

When photovoltaic module 108 is of a light-collecting type, electricity generation efficiency of solar panel unit 101 per unit area is increased and hence, an area necessary for acquiring the same electric power can be reduced. As a result, the solar panel unit can be miniaturized and light-weighted.

Figure 2C:
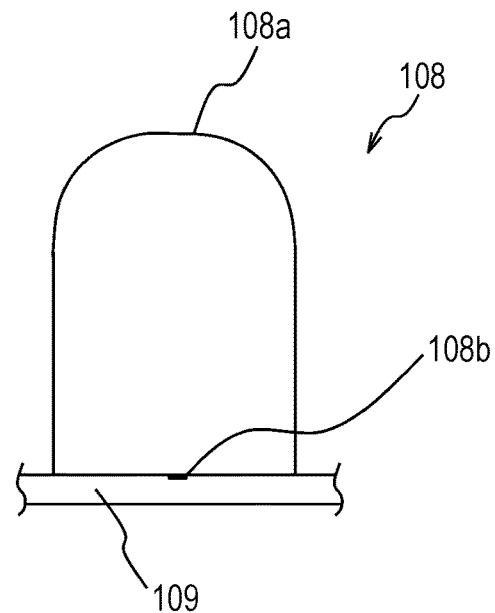
FIG. 2C is a perspective view showing one lens and one photovoltaic element of the photovoltaic module part used in the solar panel unit of the first exemplary embodiment of this disclosure.

FIG. 2A shows a case where light-collecting optical member 108a is formed of a plurality of convex lenses, and FIG. 2B shows a case where light-collecting optical member 108a is formed of one Fresnel lens. FIG. 2C is a cross-sectional view of one lens of light-collecting optical member 108a shown in FIG. 2A. Light-collecting optical member 108a shown in FIG. 2B also has the same constitution as the light-collecting optical member 108a shown in FIG. 2C.

Photovoltaic module 108 is constituted of: light-collecting optical member 108a; photovoltaic element 108b which converts light energy collected by light-collecting optical member 108a into electrical energy; and electric wire connected to photovoltaic element 108b. Second panel 103 and third panel 104 are disposed so as not to overlap with first panel 102. This means that light-collecting optical members 108a which cover photovoltaic modules 108 having light-collecting type photovoltaic elements 108b on each panel do not overlap with light-collecting optical members 108a on other panels disposed adjacent to light-collecting optical members 108a in the directions orthogonal to the front surfaces of the respective panels.

As an example, base plate 109 is made of aluminum. Base plate 109 radiates heat generated from photovoltaic module 108, and has a thickness of 1 cm. As an example, based on the thickness of photovoltaic module 108 and the thickness of base plate 109, thicknesses of first panel 102, second panel 103 and third panel 104 are set to 3 cm respectively. That is, as an example, first panel 102, second panel 103 and third panel 104 have the same thickness.

Not all light energy from the sun can be converted into electrical energy by the light-collecting optical member and hence, heat is generated in the light-collecting optical member so that a temperature of the light-collecting optical member is elevated. In view of the above, it is necessary to make a size of one photovoltaic module 108 small compared to a light-collecting optical member which does not collect light. By adopting such structure, a minimum unit for forming the structure can be made small and hence, it is possible to increase the degree of freedom in designing respective shapes of first panel 102, second panel 103 and third panel 104.

Figure 3:
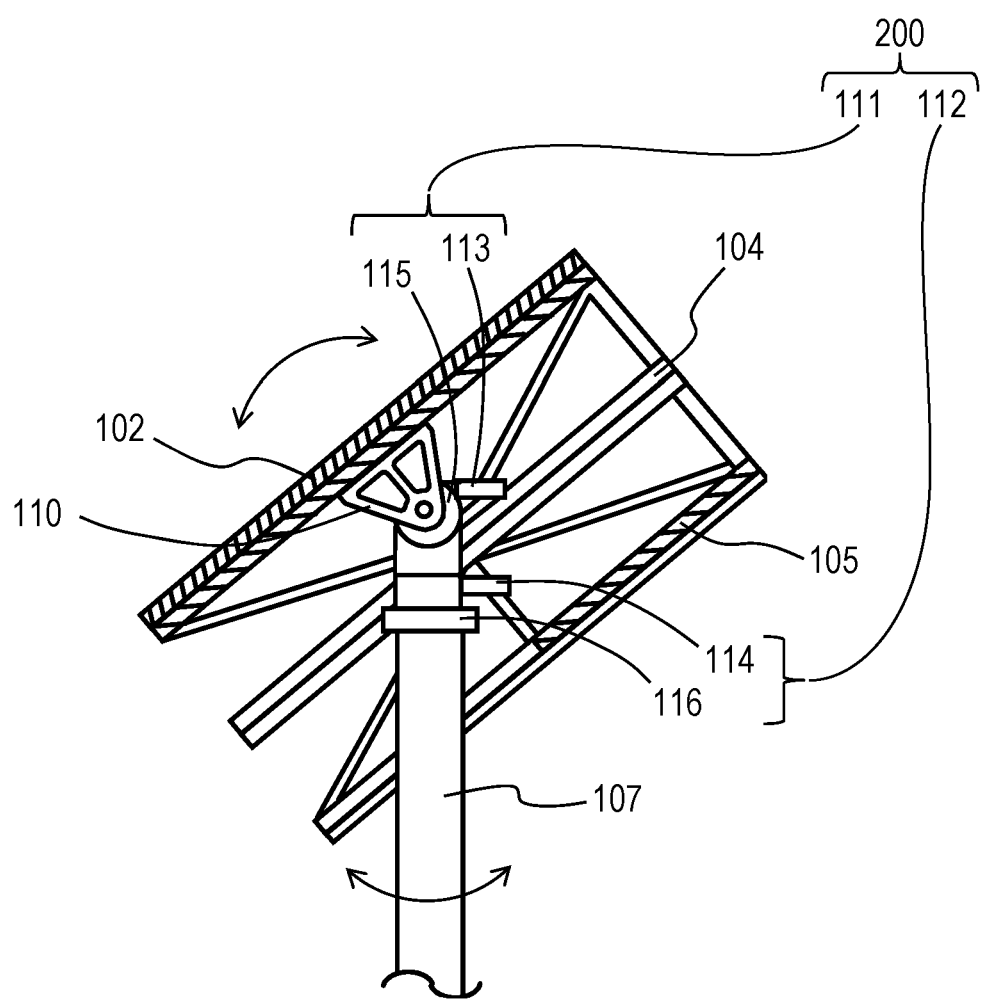
FIG. 3 is a cross-sectional side view of the solar power generation apparatus of the first exemplary embodiment of this disclosure taken along a vertical plane extending in front of a support strut.

FIG. 3 is a cross-sectional side view of solar panel unit 101 taken along a vertical plane in front of support strut 107 as viewed in the lateral direction and as viewed from a position in front of support strut 107. Joint 110A is configured such that a bottom surface of a triangular shaped plate member is fixed to a back surface of first panel 102, and a top portion of the triangular shaped plate member is rotatably connected to support strut 107. Elevation angle drive device 111 is disposed below joint 110, and azimuth drive device 112 is disposed below elevation angle drive device 111. Elevation angle drive device 111 and azimuth drive device 112 are connected to support strut 107. Elevation angle drive device 111 and azimuth drive device 112 constitute one example of a posture drive part. In other words, elevation angle drive device 111 and azimuth drive device 112 constitute one example of two-axis rotation mechanism 200. Two-axis rotation mechanism 200 is a drive mechanism for directing first panel 102, second panel 103 and third panel 104 in the direction toward the sun. By directing first panel 102, second panel 103 and third panel 104 in the direction perpendicular to sun light, energy density of sun light incident on the panels can be increased. In the case where sun light is collected by light-collecting optical member 108a, it is necessary to dispose photovoltaic element 108b at a focal point. To prevent photovoltaic element 108b from being displaced from the position of the focal point, it is necessary to provide a drive mechanism which drives first panel 102, second panel 103 and third panel 104 in the elevation angle direction as well as in the azimuth direction.

First panel 102 and two-axis rotation mechanism 200 are connected to each other by way of joint 110, and the center of gravity of solar panel unit 101 and the center of rotation axis of two-axis rotation mechanism 200 are aligned with each other. Two-axis rotation mechanism 200 is provided in a region surrounded by four panels which form solar panel unit 101, that is, first panel 102, second panel 103, third panel 104 and fourth panel 105.

Elevation angle drive device 111 is constituted of: motor 113, and speed reduction mechanism 115 connected to motor 113 and equipped with gears. The normal/reverse rotation of motor 113 is controlled by a controller (not shown in the drawing). Speed reduction mechanism 115 is connected between joint 110 and motor 113. By performing drive control of motor 113 using the controller, solar panel unit 101 can be inclined in the upward direction at a desired angle with respect to the horizontal direction by way of speed reduction mechanism 115 and joint 110.

Azimuth drive device 112 is constituted of: motor 114; and speed reduction mechanism 116 connected to motor 114 and equipped with gears. The normal/reverse rotation of motor 114 is controlled by a controller (not shown in the drawing). Speed reduction mechanism 116 is disposed between elevation angle drive device 111 and support strut 107 and is connected to motor 114. By performing a drive control of motor 114 using the controller, elevation angle drive device 111 can be rotated in the normal direction or in the reverse direction about an axis of support strut 107 by a desired angle with respect to support strut 107 by way of speed reduction mechanism 116.

In this manner, by controlling the operation and directions of motor 113 and motor 114 with respect to the elevation angle direction as well as azimuth direction, an elevation angle and an azimuth of solar panel unit 101 can be changed so as to adjust solar panel unit 101 such that the sun is positioned in the normal direction of the front surface of solar panel unit 101. For enabling such adjustment, first panel 102, second panel 103 and third panel 104 which form solar panel unit 101 are required to be disposed parallel to each other.

The constitution of the panels is described by reference to FIG. 4. AH panels have a rectangular shape, and are parallel to each other. FIG. 4 is a cross-sectional view of solar panel unit 101 taken along a horizontal plane in a state where solar panel unit 101 is erected in the vertical direction. Assume a width of first panel 102 as W1, a width of second panel 103 as W2, a width of third panel 104 as W3, and a width of fourth panel 105 as W4. The respective panels have the same length.

Assume a step formed between first panel 102 and second panel 103 and a step formed between first panel 102 and third panel 104 as S1, and a step formed between fourth panel 105 and second panel 103 and a step formed between fourth panel 105 and third panel 104 as S2.

To simplify the study made hereinafter, assume that width W1 is equal to width W4 (W1=W4), width W2 is equal to width W3 (W2=W3) and step S1 is equal to step S2 (S1=S2). Further, a total panel unit width is defined as a width from an edge of second panel 103 to an edge of third panel 104, that is, W1+W2+W3.

The constitution of the panel and a wind load is described hereinafter based on flows of wind.

Figure 5A:
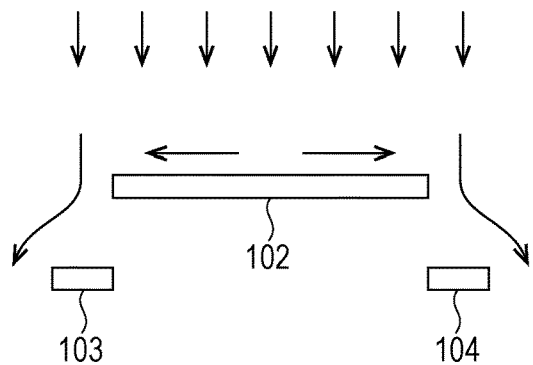
FIG. 5A is a schematic view showing the direction of air which flows in the vicinity of a solar panel unit having the two-stage structure as a comparison example used in the description of the first exemplary embodiment of this disclosure.
Figure 5B:
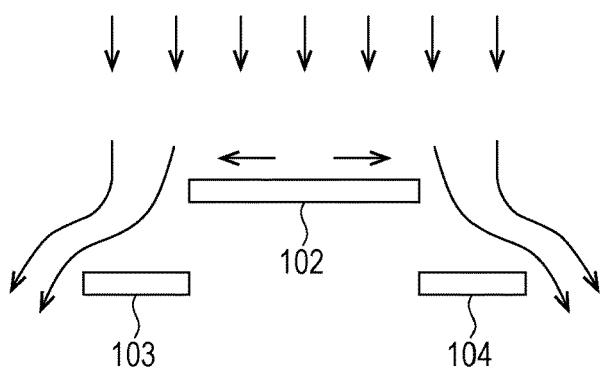
FIG. 5B is a schematic view showing the direction of air which flows in the vicinity of a solar panel unit having the two-stage structure as a comparison example used in the description of the first exemplary embodiment of this disclosure.
Figure 5C:
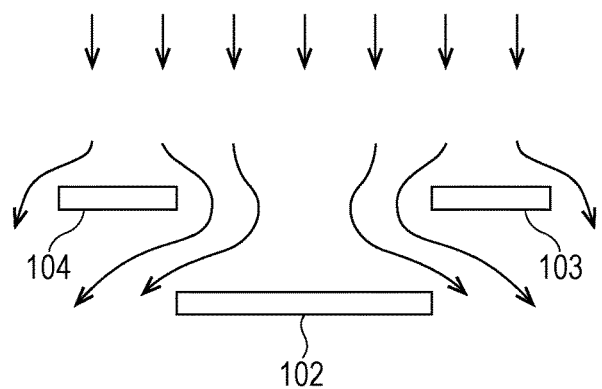
FIG. 5C is a schematic view showing the direction of air which flows in the vicinity of a solar panel unit having the two-stage structure as a comparison example used in the description of the first exemplary embodiment of this disclosure.

FIG. 5A to FIG. 5C show, as comparison examples, the flows of wind in the case that a two-stage structure is adopted where first panel 102 is disposed at the center of solar panel unit 101 and second panel 103 and third panel 104 having a narrow width are disposed on both sides of first panel 102 with a step formed between first panel 102 and second panel 103 and a step formed between first panel 102 and third panel 104. The case is studied where first panel 102, second panel 103 and third panel 104 are parallel to each other, first panel 102, second panel 103 and third panel 104 are formed of flat plates which extend in the thickness direction of papers on which FIG. 5A to FIG. 5C are drawn, and a wind blows in the direction perpendicular to a panel surface of first panel 102, a panel surface of second panel 103 and a panel surface of third panel 104.

FIG. 5A shows, as the comparison example, the case of the two-stage structure where first panel 102 is disposed on a windward side of second panel 103 and third panel 104, and has a wider width than second panel 103 and third panel 104. In this case, a wind which impinges on first panel 102 from a front side flows toward the outside from the inside along the panels. As a result, a wind which blows toward second panel 103 and third panel 104 impinges on air which flows toward the outside from first panel 102 so that it is possible to prevent the wind from directly impinging on second panel 103 and third panel 104. Accordingly, a wind load received by the first, second and third panels as a whole is reduced.

In the same manner as the comparison example shown in FIG. 5A, FIG. 5B shows, as another comparison example, the case of the two-stage structure where first panel 102 is disposed on a windward side of second panel 103 and third panel 104, and has a wider width than second panel 103 and third panel 104. In this case, however, a width of first panel 102 is smaller than a width of first panel 102 shown in FIG. 5A. In this case, all wind which blows toward second panel 103 and third panel 104 from a front side cannot be pushed out by air which flows toward the outside from first panel 102 and hence, a part of air impinges on second panel 103 and third panel 104. However, an amount of wind which impinges on second panel 103 and third panel 104 is reduced and hence, a wind load received by the first, second and third panels as a whole is reduced.

FIG. 5C shows, as the comparison example, the case of the two-stage structure where first panel 102 is disposed on a leeward side of second panel 103 and third panel 104. In this case, all wind which blows toward first panel 102, second panel 103 and third panel 104 from a front side impinges on first panel 102, second panel 103 and third panel 104 and hence, a wind load received by first panel 102, second panel 103 and third panel 104 as a whole is not reduced.

In this manner, since a wind blows to the panels from all directions, a wind load is not reduced by the two-stage structure shown in FIG. 5A.

Figure 6A:
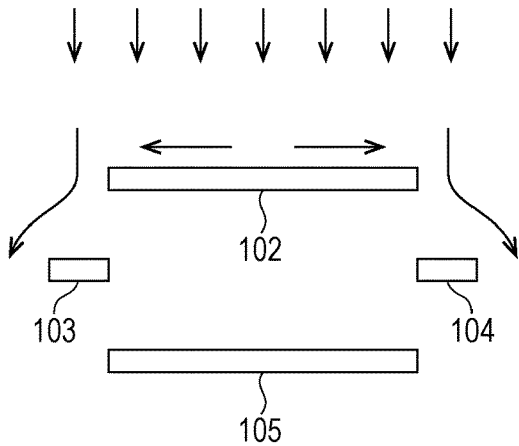
FIG. 6A is a schematic view showing the direction of air which flows in the vicinity of the solar panel unit of the first exemplary embodiment of this disclosure when a wind blows to a panel surface of the solar panel unit in the direction perpendicular to the panel surface.
Figure 6B:
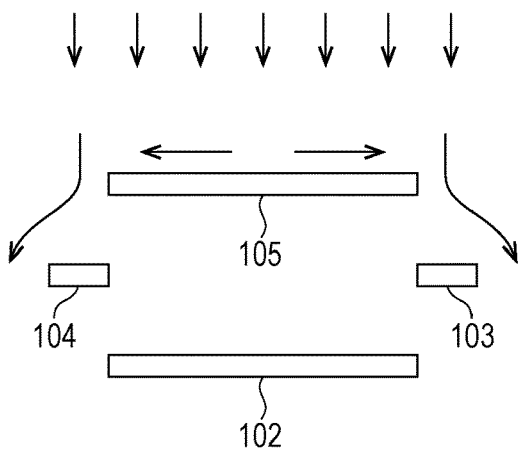
FIG. 6B is a schematic view showing the direction of air which flows in the vicinity of the solar panel unit of the first exemplary embodiment of this disclosure when a wind blows to a panel surface of the solar panel unit in a state where the solar panel unit is rotated by 180 degrees from the state shown in FIG. 6A.

On the other hand, provided that the panel having a wide width disposed at the center of solar panel unit 101 is positioned on a windward side, a wind load received by the panels as a whole is reduced so long as a wind which blows in the direction perpendicular to the front surface of the panel is concerned. FIG. 6A and FIG. 6B show the three-stage structure where fourth panel 105 is further provided at a position corresponding to the position of first panel 102 (a position symmetrical with the position of first panel 102) with respect to second panel 103 and third panel 104. Solar panel unit 101 of the first exemplary embodiment of this disclosure adopts such panel constitution of the three-stage structure.

FIG. 6A shows the case where wind blows to front surfaces of first panel 102, second panel 103 and third panel 104 in the direction perpendicular to the panels from a front side. In the same manner as FIG. 5A and FIG. 5B, when a wind blows from a front side, air present on the front surfaces of the panels flows and hence, a wind load is reduced. First panel 102, second panel 103 and third panel 104 are disposed on a windward side with respect to fourth panel 105 in the wind blowing direction and hence, wind does not impinge on fourth panel 105. FIG. 6B shows a state where solar panel unit 101 is rotated by 180 degrees from a state shown in FIG. 6A so that fourth panel 105 projects frontwardly with respect to second panel 103 and third panel 104. Also in the state shown in FIG. 6B, in the same manner as FIG. 5A and FIG. 5B, when a wind blows from a front side, air present on the front surfaces of the panels flows and hence, a wind load is reduced, That is, FIG. 6B shows the case where fourth panel 105 is disposed on a windward side of second panel 103 and third panel 104, and has a wider width than second panel 103 and third panel 104. In this case, a wind which impinges on fourth panel 105 flows toward the outside from the inside along fourth panel 105. As a result, a wind which blows toward second panel 103 and third panel 104 impinges on air which flows toward the outside from fourth panel 105 so that it is possible to prevent the wind from directly impinging on second panel 103 and third panel 104, Accordingly, a wind load received by fourth panel 105, second panel 103 and third panel 104 as a whole is reduced. In this case, second panel 103, third panel 104 and fourth panel 105 are disposed on a windward side with respect to first panel 102 in the wind blowing direction and hence, the wind does not impinge on first panel 102.

A wind load is studied with respect to the cases where a blowing wind and the panels have the relationships shown in FIG. 5B, FIG. 5C and FIG. 6A respectively.

As an example of the panels, assume that a width of first panel 102 is 0.6 m, a width of fourth panel 105 is 0.6 m, a width of second panel 103 is 0.2 m, a width of third panel 104 is 0.2 m, a length of first panel 102 is 1 m, a length of second panel 103 is 1 m, a length of third panel 104 is 1 m, a length of fourth panel 105 is 1 m, a thickness of first panel 102 is 3 cm, a thickness of second panel 103 is 3 cm, a thickness of third panel 104 is 3 cm, a thickness of fourth panel 105 is 3 cm, a size of step S1 is 35 cm, and a size of step S2 is 35 cm. On the premise that wind blows from the direction perpendicular to panel surfaces, a numerical analysis is carried out with respect to a uniform flow where a wind speed is 20 m/s which is a maximum wind speed when solar panel unit 101 is operated.

It is found through the analysis that a wind load received by solar panel unit 101 having the three-stage structure shown in FIG. 6A is 193 N under the above-mentioned conditions. It is also found through the analysis that a wind load received by solar panel unit 101 having the two-stage structure shown in FIG. 5B where first panel 102 is positioned on a windward side is 186 N. It is also found through the analysis that a wind load received by solar panel unit 101 having the two-stage structure shown in FIG. 5C where first panel 102 is positioned on a leeward side is 289 N. That is, it is found that a wind load is reduced in solar panel unit 101 having the symmetrical three-stage structure in both of the case where a wind blows toward the panels from a front side and the case where a wind blows toward the panels from a rear side. On the other hand, it is also found that, in solar panel unit 101 having the asymmetrical two-stage structure, a wind load becomes large when a wind blows to the panels from either one of a front side and a back side.

Figure 17:
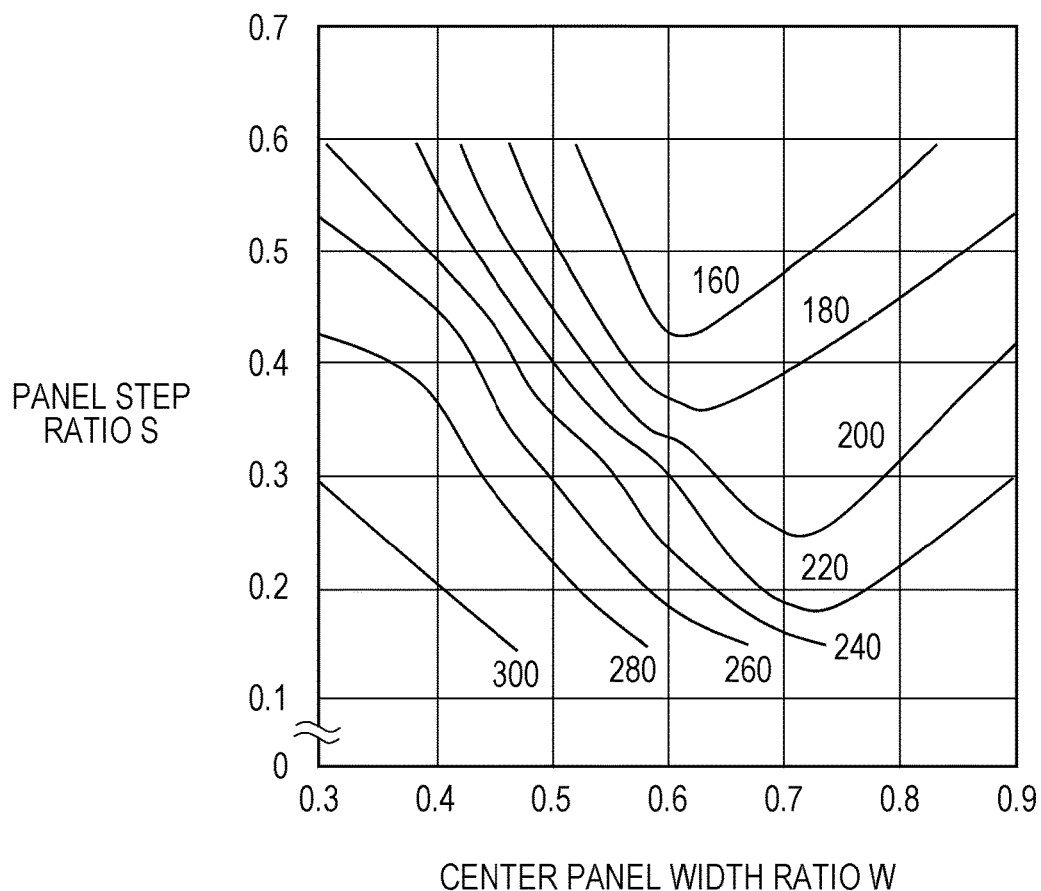
FIG. 17 is a graph showing wind loads obtained by changing a center panel width ratio W and a panel step ratio S in the three-stage panel structure when a wind blows to the panel in the direction perpendicular to the panel under conditions where a total panel unit width is set to 1 m and a length of each panel is set to 1 m.

FIG. 17 is a graph showing the relationship between center panel width ratio W and panel step ratio S with respect to a wind load applied to solar panel unit 101 having the three-stage structure shown in FIG. 6A. FIG. 17 shows the case where a wind blows from the direction perpendicular to the panel surfaces.

It is understood that as a width of first panel 102 or fourth panel 105 disposed at the center is wider or as the panel step is wider, a wind load received by the panels as a whole becomes smaller. This is because air on a windward side impinges on first panel 102 or fourth panel 105, flows toward the outside, and impinges on a wind which blows toward second panel 103 and third panel 104 so that an amount of wind which impinges on second panel 103 and third panel 104 is reduced.

The reason why a wind load is increased when a panel width ratio of first panel 102 or fourth panel 105 disposed at the center becomes larger than 0.8 is that widths of second panel 103 and third panel 104 are narrowed so that the previously-mentioned wind load reducing effect is reduced.

In FIG. 17, measurement ranges of panel width ratio W and a panel step ratio S are set to $0.3 \leq W \leq 0.9$ and $0.15 \leq S \leq 0.6$ respectively.

As can be understood from FIG. 17, the panel structure which satisfies the following conditions receives a wind load of 270 N or less (wind load≤270 N) which is approximately 90% of a wind load received by one flat plate.

0.73-0.77W≤S at 0.30≤W≤0.43
1.48-2.50W≤S at 0.43≤W≤0.47
0.82-1.11W≤S at 0.47≤W≤0.56
0.66-0.83W≤S at 0.56≤W≤0.62
0.15≤S at 0.62≤W≤0.90

The panel structure which satisfies the following conditions receives a wind load of 240 N or less (wind load 240 N) which is approximately 80% of a wind load received by one flat plate.

0.90-1.00W≤S at 0.30≤W≤0.40
1.02-1.30W≤S at 0.40≤W≤0.63
0.52-0.50W≤S at 0.63≤W≤0.73
0.15≤S at 0.73≤W≤0.90

In the numerical analysis, a wind load is obtained with respect to a center panel width ratio W and a panel step ratio S under conditions where a total panel unit width is set to 1 m and a length of each panel is set to 1 m. In fluid dynamics, the proportional relationship is established between a relative shape of a panel and a wind load received by the panel as a whole even when an actual length or an actual width is changed. Accordingly, when the panel structure has the relationship which falls within the above-mentioned range, the panel structure receives a wind load which is 90% or less or 80% or less of a wind load received by one flat plate.

According to solar panel unit 101 of the first exemplary embodiment having the three-stage structure formed of four panels consisting of first panel 102, second panel 103, third panel 104 and fourth panel 105, a wind load can be reduced whichever the case where a wind blows from a front side of solar panel unit 101 (a front surface side of first panel 102, in other words, a side where a surface of first panel 102 faces the sun) but also the case where a wind blows from a back side (a back surface side of fourth panel 105, in other words, a side opposite to a surface of fourth panel 105 which faces first panel 102 in an opposed manner). That is, according to solar panel unit 101 of the first exemplary embodiment of this disclosure, in both of the case where a wind blows to solar panel unit 101 from a front side and the case where a wind blows to solar panel unit 101 from a back side, a wind load received by first panel 102, second panel 103, third panel 104 and fourth panel 105 can be reduced compared to the conventional solar panel unit having the two-stage structure.

Figure 18:
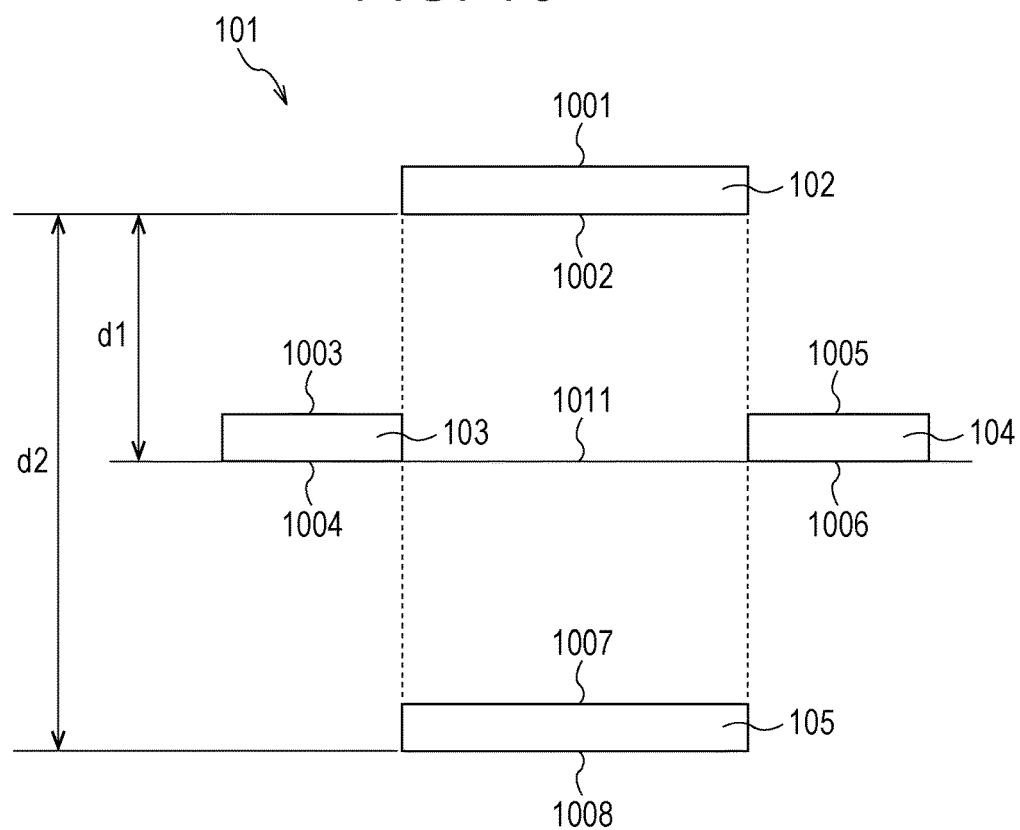
FIG. 18 is a cross-sectional view of the solar panel unit of the first exemplary embodiment of this disclosure shown in FIG. 1 taken along a horizontal plane in a state where the panels are erected in the vertical direction.
Figure 19:
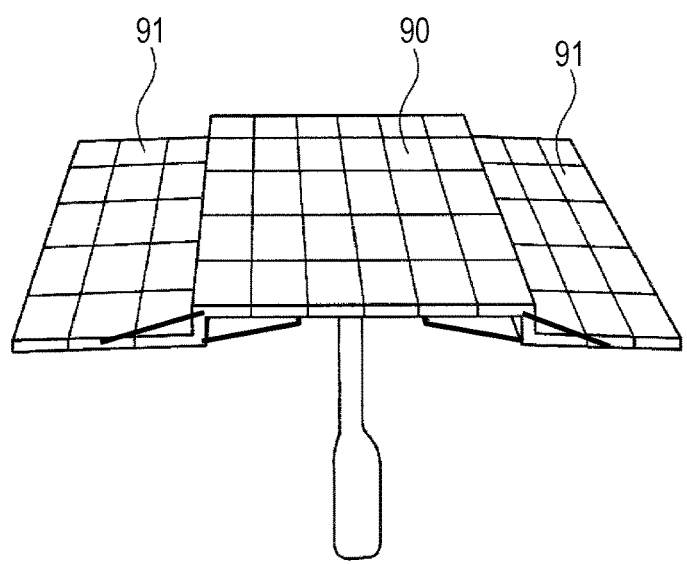
FIG. 19 is a perspective view of a conventional solar panel unit.

FIG. 18 shows solar panel unit 101 shown in FIG. 4 in detail. First panel 102 has: first surface 1001; second surface 1002 forming a surface on a side opposite to first surface 1001; and a first photovoltaic module which receives sun light from first surface 1001. Second panel 103 has: third surface 1003; fourth surface 1004 forming a surface on a side opposite to third surface 1003; and a second photovoltaic module which receives sun light from third surface 1003. Third panel 104 has: fifth surface 1005; sixth surface 1006 forming a surface on a side opposite to fifth surface 1005; and a third photovoltaic module which receives sun light from fifth surface 1005. Fourth panel 105 has: seventh surface 1007; and eighth surface 1008 forming a surface on a side opposite to seventh surface 1007. Fourth surface 1004 and sixth surface 1006 are present on the same imaginary plane 1011. Second surface 1002, eighth surface 1008 and imaginary plane 1011 are parallel to each other. First distance d1 between second surface 1002 and imaginary plane 1011 is smaller than second distance d2 between second surface 1002 and eighth surface 1008. If second surface 1002 is vertically moved to imaginary plane 1011 without being moved horizontally, second surface 1002 overlaps with neither fourth surface 1004 nor sixth surface 1006. If seventh surface 1007 is vertically moved to imaginary plane 1011 without being horizontally moved, seventh surface 1007 overlaps with neither fourth surface 1004 nor sixth surface 1006. As shown in FIG. 3, first panel 102 may be directly connected to joint 110 forming a connecting portion which is connected to support strut 107 forming a support portion. On the other hand, second panel 103, third panel 104 and fourth panel 105 may not be directly connected to the connecting portion and, as shown in FIG. 3, first panel 102, second panel 103, third panel 104 and fourth panel 105 may be connected to each other.

Second Exemplary Embodiment

In the case where first panel 102, second panel 103, third panel 104 and fourth panel 105 according to the first exemplary embodiment receive a wind from an oblique direction, usually, it is estimated that the panels generally receive the largest load when the panel receives a wind from the direction inclined from the normal direction of the panel by 45 degrees. In the case of the panel structure according to the first exemplary embodiment, however, a wind which passes between the panels disposed on a windward side impinges on the panel positioned on the center on a leeward side. Accordingly, it is estimated that the direction of a wind which imposes the largest load on the panels is not the direction inclined from the normal direction of the panel by 45 degrees. As a result of simulation, it is found that, in the case where solar panel unit 101 has four panels consisting of first panel 102, second panel 103, third panel 104 and fourth panel 105, the largest load is imposed on the panel when the panels receive a wind from particular directions.

In view of the above, by designing a solar panel unit so as to withstand a wind from particular directions under the condition where an amount of air is fixed, the panel unit can withstand wind from any directions. Hereinafter, solar panel unit 101 which is designed so as to withstand a wind from particular directions is described as a second exemplary embodiment.

Figure 6C:
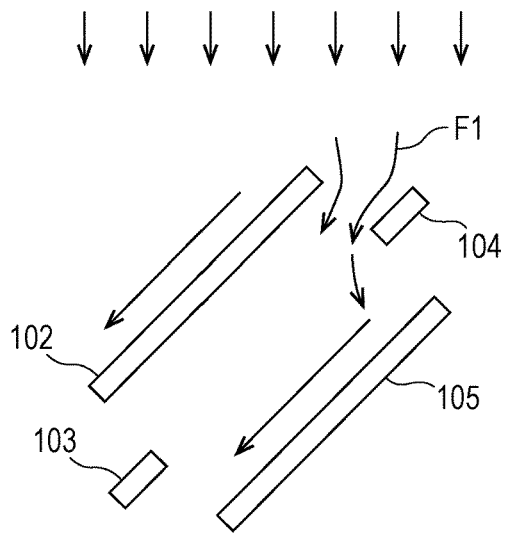
FIG. 6C is a schematic view showing the direction of air which flows in the vicinity of a solar panel unit of a second exemplary embodiment of this disclosure when a wind blows to a panel surface of the solar panel unit from the oblique direction.

FIG. 6C shows the case where a wind blows from the oblique direction to solar panel unit 101 according to the first exemplary embodiment having the three-stage structure. In this case, wind F1 blown into between first panel 102 and third panel 104 impinges on fourth panel 105 disposed on the center on a rear side, and flows along a front surface of fourth panel 105. Accordingly, it is estimated that a wind load which acts on fourth panel 105 is larger than a load in the case shown in FIG. 6A and a load in the case shown in FIG. 6B. It is also estimated that an amount of wind load changes in accordance with an angle at which a wind blows to the panel.

Figure 7:
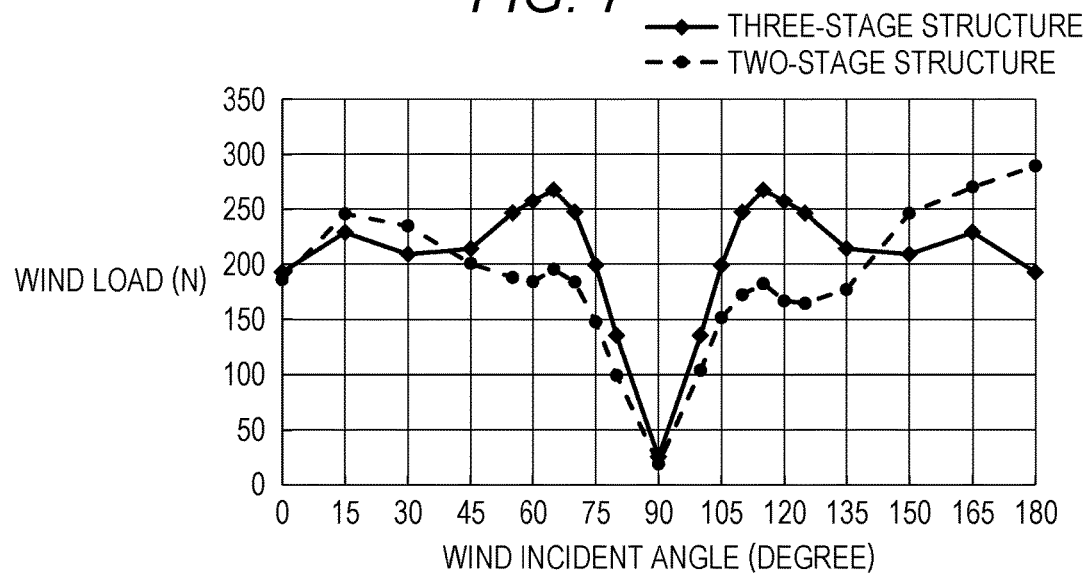
FIG. 7 is a graph showing the relationship between an incident angle of wind which blows to a panel surface of a solar panel unit having the two-stage structure and a wind load received by panels of the unit as a whole in comparison with the solar panel unit of the second exemplary embodiment of this disclosure.

In view of the above, the relationship between an angle at which a wind blows to the panel and a wind load are investigated, and the result is shown in FIG. 7. A wind incident angle indicates an angle made by the normal direction of a panel and a wind. The panel structure has the left-and-right symmetrical structure so that the distribution of a wind load within a range from 180 degrees to 360 degrees is the mirror reflection of the distribution of a wind load within a range from 0 degree to 180 degrees.

Conditions are as follows. A width of first panel 102 is 0.6 m, a width of second panel 103 is 0.2 m, a width of third panel 104 is 0.2 m, and a width of fourth panel 105 is 0.6 m. Lengths of first panel 102, second panel 103, third panel 104 and fourth panel 105 are 1 m respectively. Thicknesses of first panel 102, second panel 103, third panel 104 and fourth panel 105 are 3 cm respectively. Sizes of step S1 and step S2 are 35 cm respectively. A numerical analysis is carried out with respect to a uniform flow where a wind speed is 20 m/s which is a maximum wind speed during the operation of solar panel unit 101. For a comparison purpose, a result obtained with respect to solar panel unit 101 having the two-stage structure which is not provided with fourth panel 105 is also shown. In solar panel unit 101 having the two-stage structure, a wind incident angle of 0 degree indicates the case where first panel 102 is disposed on a windward side of second panel 103 and third panel 104, and a wind impinges on a surface of first panel 102 from the direction perpendicular to the surface of first panel 102. A wind incident angle of 180 degrees indicates the case where first panel 102 is disposed on a leeward side of second panel 103 and third panel 104, and a wind impinges on the surface of first panel 102 from the direction perpendicular to the surface of first panel 102. It can be understood from FIG. 7 that the panel receives the largest wind load in solar panel unit 101 having the three-stage structure when a wind incident angle is 65 degrees. On the other hand, it can be understood that the panel receives the largest wind load in solar panel unit 101 having the two-stage structure when a wind incident angle is 180 degrees. It can be also understood that a maximum wind load in solar panel unit 101 having the three-stage structure is smaller than a maximum wind load in solar panel unit 101 having the two-stage structure by approximately 10%. It is also understood from FIG. 7 that even in the case where first panel 102 is disposed on a windward side of second panel 103 and third panel 104, and an incident angle of a wind with respect to first panel 102 is 15 degrees or 30 degrees which make first panel 102 disposed approximately perpendicular to the direction of a wind, a wind load in solar panel unit 101 having the three-stage structure is small compared with a wind load in solar panel unit 101 having the two-stage structure.

In the case where first panel 102 or fourth panel 105 disposed at the center has a large width, a wind load imposed on first panel 102 or fourth panel 105 when a wind blows to the panel from the oblique direction becomes large. As a width of first panel 102 or fourth panel 105 disposed at the center is narrower, a wind load imposed on second panel 103 or third panel 104 when a wind blows to the panel from the direction perpendicular to second panel 103 or third panel 104 becomes larger.

In view of the above, maximum wind loads when an incident angle of a wind with respect to the panel is changed to various values are obtained. In this case, an incident angle of a wind with respect to the panel is changed by changing a center panel width ratio W which is a ratio of a width of first panel 102 or fourth panel 105 disposed at the center to a total panel unit width and a panel step ratio S which is a ratio of a size of a step between the panels and the total panel unit width. A larger wind load is taken between a wind load imposed on the panel at a wind incident angle of 0 degree and a wind load imposed on the panel at a wind incident angle of 65 degrees, and the result is shown in FIG. 8.

To express center panel width ratio W and panel step ratio S using symbols indicated in FIG. 4, the center panel width ratio W can be expressed as W1/(W1+W2+W3), and the panel step ratio S can be expressed as S1/(W1+W2+W3) or S2/(W1+W2+W3).

Figure 8:
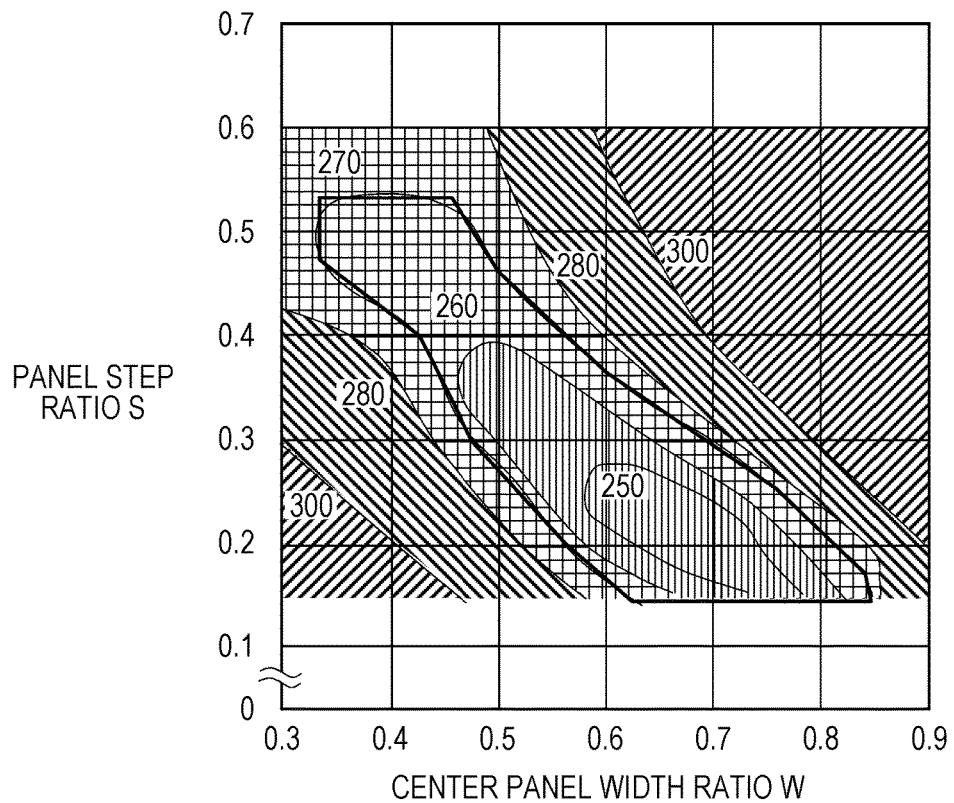
FIG. 8 is a graph showing the relationship between a maximum wind load received by the solar panel unit of the second exemplary embodiment of this disclosure at a wind speed of 20 m/s, a center panel width ratio and a panel step ratio.

As can be understood from FIG. 8, even when a wind blows to the panels from any side, the panel structure which satisfies the following conditions receives a wind load of 270 N or less.

0.73-0.77W≤S at 0.33≤W≤0.43
1.48-2.50W≤S at 0.43≤W≤0.47
0.82-1.11W≤S at 0.47≤W≤0.56
0.66-0.83W≤S at 0.56≤W≤0.62
0.15≤S at 0.62≤W≤0.85
and
S≤0.53 at 0.33≤W≤0.46
S≤1.34-1.75W at 0.46≤W≤0.50
S≤0.91-0.90W at 0.50≤W≤0.60
S≤0.69-0.56W at 0.60≤W≤0.76
S≤1.02-1.00W at 0.76≤W≤0.84
S≤2.70-3.00W at 0.84≤W≤0.85

In a numerical analysis, a wind load is obtained with respect to center panel width ratio W and panel step ratio S under conditions where a total panel unit width is set to 1 m and a length of each panel is set to 1 m. In fluid dynamics, the proportional relationship is established between relative shapes of panels and a wind load received by the panels as a whole even when an actual length or an actual width is changed. Accordingly, when the panel structure has the relationship which falls within the above-mentioned range, the panel structure receives a wind load which is 90% or less of a wind load received by one flat plate.

Figure 9:
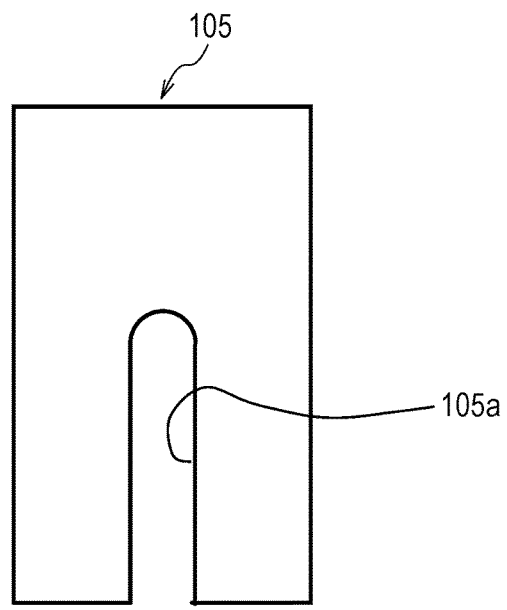
FIG. 9 is a front view of a fourth panel of the solar panel unit of the second exemplary embodiment of this disclosure.

For the sake of simplifying the numerical analysis, fourth panel 105 is also formed of a flat plate. However, in the case where all panels are connected to first panel 102 and first panel 102 is connected to support strut 107 by way of joint 110 as shown in FIG. 3, at the time of inclining the panels in the elevation angle direction as a whole, fourth panel 105 interferes with support strut 107 unless fourth panel 105 is modified in shape. Accordingly, as shown in FIG. 9, cutaway portion 105a is formed in fourth panel 105 by cutting away a portion of fourth panel 105 ranging from a center portion to an outer end. As a result, support strut 107 can go into or out from cutaway portion 105a, thus preventing the interference between support strut 107 and fourth panel 105.

Figure 10:
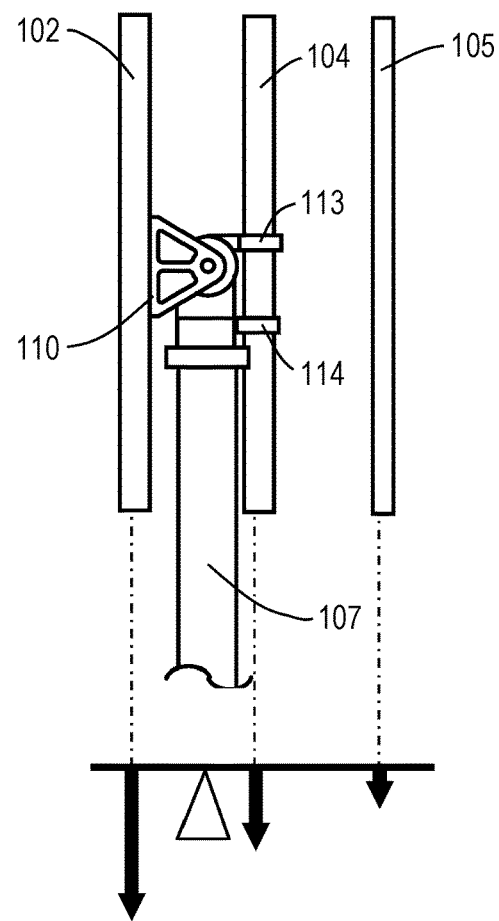
FIG. 10 is a view showing the relationship between positions of the panels and a support strut, weights in the vertical direction of the panels and the support strut and a supporting state in the solar panel unit of the second exemplary embodiment of this disclosure, wherein the view is taken along a plane perpendicular to the panels at a position behind the support strut in a state where the panels are erected in the vertical direction and beams which connect panels to each other are omitted.

In FIG. 10, for facilitating the understanding of the relationship between positions of solar panel unit 101 and support strut 107 of solar power generation apparatus 810 and own weights of panels of solar panel unit 101, beams 106 for connecting panels are omitted. First panel 102 which is a panel for generating electric power and having the largest width has the largest weight (the largest downward arrow shown in FIG. 10). Second panel 103 and third panel 104 which are power generating panels and have a narrow width have the second largest weight (the second largest downward arrow shown in FIG. 10). It is sufficient for fourth panel 105 to have the same windbreak function as first panel 102 and hence, it is unnecessary for fourth panel 105 to have a large weight. Accordingly, a weight of fourth panel 105 can be set smaller than weights of other panels, that is, first panel 102, second panel 103 and third panel 104 (the shortest downward arrow shown in FIG. 10). A thickness of fourth panel 105 may be thin.

In this embodiment, support strut 107 is disposed at the position where a moment generated by own weight of solar panel unit 101 is canceled. By disposing support strut 107 at such a position, a torque necessary for driving solar panel unit 101 in the elevation angle direction can be minimized. As the torque is smaller, a force necessary for driving solar panel unit 101 in the elevation angle direction becomes smaller. Accordingly, energy saving can be realized so that it is possible to acquire an advantageous effect that motor 113 is miniaturized.

As can be understood from FIG. 10, by reducing an offset amount between the center of gravity of solar panel unit 101 and the rotation center of solar panel unit 101 in the elevation angle direction as described above, two-axis rotation mechanism 200 can be positioned in a region surrounded by first panel 102, second panel 103, third panel 104 and fourth panel 105. As a result, it is possible to prevent a phenomenon where a wind impinges on the two-axis rotation mechanism 200 so that a wind load is increased.

As the weight of fourth panel 105 is smaller, the weight of whole solar panel unit 101 becomes smaller. Accordingly, even when the same offset amount is mounted between the center of gravity of solar panel unit 101 and the rotation center of solar panel unit 101 in the elevation angle direction, a torque necessary for driving solar panel unit 101 can reduced. Accordingly, energy saving can be realized so that motor 113 can be miniaturized.

According to the second exemplary embodiment; by designing and constituting solar panel unit 101 such that solar panel unit 101 can withstand a wind from the direction inclined from the normal direction of the panel by 65 degrees under the condition where an amount of air is fixed (the panel constitution which satisfies the above-mentioned relationship between center panel width ratio W and panel step ratio S), solar panel unit 101 can withstand a wind from any direction by reducing a wind load with more certainty.

Third Exemplary Embodiment

In the third exemplary embodiment of this disclosure, through holes and lids are provided to fourth panel 105. Fourth panel 105 is provided for breaking a wind. Fourth panel 105 is disposed in the shade of first panel 102 so that it is unnecessary to mount a solar cell battery such as a photovoltaic element on fourth panel 105. Accordingly, the through holes and the lids are provided to fourth panel 105 for adjusting the flow of a wind by opening or closing the through holes and hence, fourth panel 105 can make a wind from the oblique direction flow along a surface of fourth panel 105 and through the through holes. Hereinafter, this constitution is described hereinafter.

With respect to the three-stage structure shown in FIG. 6A, FIG. 6B and FIG. 6C, it is found that when a wind blows to the panels from the direction inclined from the normal direction of the panel by 65 degrees, that is, when a wind blows from the oblique direction, a wind impinges on fourth panel 105 disposed at the center on a leeward side and first panel 102 and hence, a wind load is increased. When a wind blows from such a direction, a wind load received by the two-stage structure is smaller than a wind load received by the three-stage structure. On the other hand, when a wind blows to the panel from the direction inclined from the normal direction of the panel by 45 degrees or less, that is, when a wind blows to the panel from the direction approximately perpendicular to the panels, as can be understood from FIG. 7, a wind load received by the three-stage structure is smaller than a wind load received by the two-stage structure. When an angle made by panel 102 and the wind blowing direction is 15 degrees or less, that is, when a wind blows to the panels from the direction approximately parallel to panel 102, a wind minimally impinges on the panel and hence, a wind load is small. In view of the above, by adopting the three-stage structure when an intersecting angle made by the normal direction of the panel and the wind direction is 45 degrees or less, and by adopting the two-stage structure when an intersecting angle made by the normal direction of the panel and the wind direction is 45 degrees or more, a wind load can be further reduced.

First panel 102, second panel 103 and third panel 104 are power generating panels and generate electric power from the sun light and hence, it is necessary to direct panel surfaces of these panels toward the sun. On the other hand, fourth panel 105 is not a power generating panel, and is a panel provided for suppressing a wind load when a wind blows from a fourth panel side. Accordingly, fourth panel 105 is not necessarily formed of a flat plate provided that a wind load suppression purpose can be satisfied.

Figure 11A:
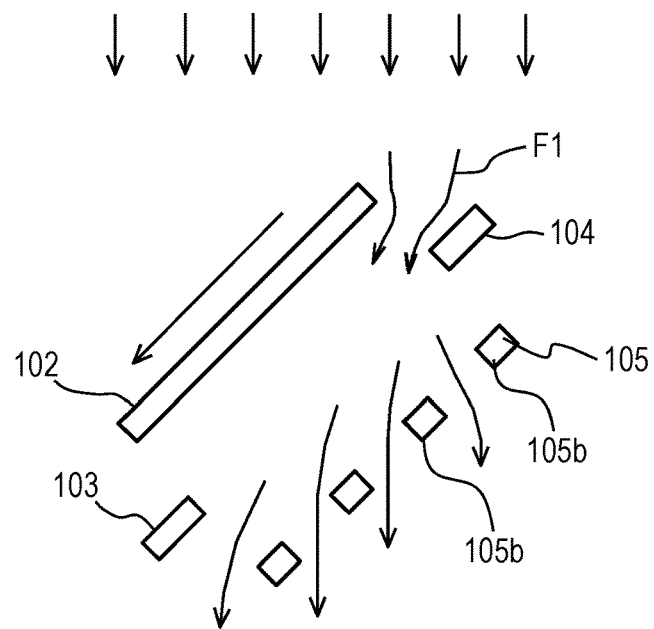
FIG. 11A is a schematic view showing the direction of air which flows in the vicinity of a solar panel unit of a third exemplary embodiment when a wind blows to a panel from the oblique direction and a fourth panel is disposed on a leeward side.

FIG. 11A is a cross-sectional view showing the case where wind blows to the panels from the oblique direction and fourth panel 105 is positioned on a leeward side. A large number of through holes 105b are formed in fourth panel 105. The flow of wind is indicated by arrows. A wind F1 which flows into a space on a back side of first panel 102 passes through holes 105b formed in fourth panel 105.

Figure 11B:
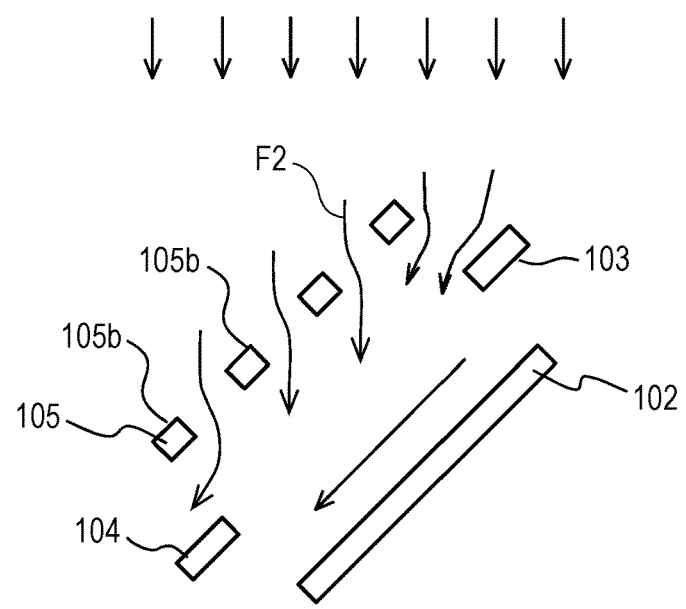
FIG. 11B is a schematic view showing the direction of air which flows in the vicinity of the solar panel unit of the third exemplary embodiment when a wind blows to the panel from the oblique direction and the fourth panel is disposed on a windward side.

FIG. 11B is a cross-sectional view showing the case where wind blows to the panels from the oblique direction and fourth panel 105 is positioned on a windward side. As described above, a large number of through holes 105b are formed in fourth panel 105. A wind F2 which blows to fourth panel 105 passes through holes 105b formed in fourth panel 105. In this manner, by forming through holes 105b in fourth panel 105, a wind blows through the three-stage structure in the same manner as the wind which flows through the two-stage structure.

Figure 12A:
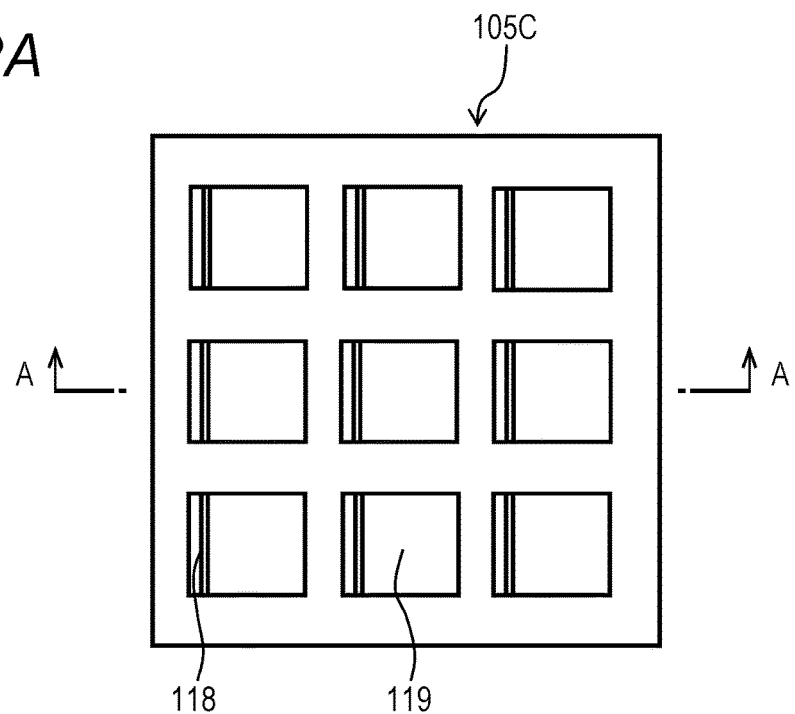
FIG. 12A is a plan view of a fourth panel of the solar panel unit of the third exemplary embodiment.
Figure 12B:
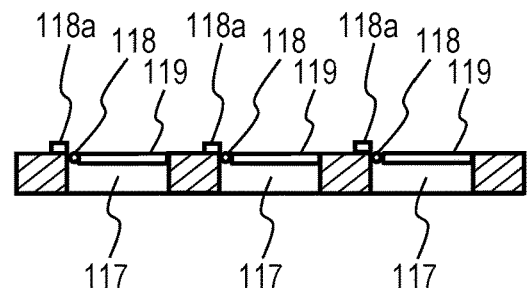
FIG. 12B is a cross-sectional view taken along a line A-A in FIG. 12A as viewed in the direction indicated by arrows.
Figure 12C:
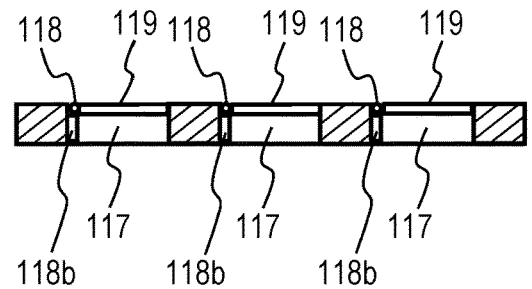
FIG. 12C is a cross-sectional view taken along a line A-A in FIG. 12A as viewed in the direction indicated by arrows when positions of hinge fixing portions are different from positions of hinge fixing portions shown in FIG. 12A.

FIG. 12A, FIG. 12B and FIG. 12C show one example of fourth panel 105C having the structure where fourth panel 105C blocks a wind or allows a wind to pass therethrough depending on the wind direction with respect to panel 105C.

FIG. 12A is a plan view of fourth panel 105C, and FIG. 12B is a cross-sectional view of fourth panel 105C taken along a line A-A in FIG. 12A and viewed in the direction indicated by arrows. In FIG. 12B, numeral 117 indicates the through holes. Lid plates 119 which constitute one example of lids for closing through holes 117 are openably mounted on fourth panel 105C by way of hinges 118. Lid plates 119 are mounted on a surface of fourth panel 105C on a side opposite to a surface of fourth panel 105C which faces first panel 102. Outer surfaces of lid plates 119 and an outer surface of fourth panel 105C are disposed on the same plane. As a result, it is possible to suppress a phenomenon that the flow of wind is disturbed at boundaries between fourth panel 105C and the lids so that a wind load is increased. In FIG. 12A, the elevation angle direction of fourth panel 105 is the vertical direction in FIG. 12A. By setting the elevation angle direction to such a direction, an influence of own weight of lid plate 119 exerted on lid plate 119 in the opening direction of lid plate 119 can be minimized. FIG. 12A and FIG. 12B show the cases where fixing portion 118a of hinge 118 is mounted on a flat portion of fourth panel 105C disposed around through hole 117. On the other hand, FIG. 12C is a cross-sectional view of fourth panel 105C as viewed in the direction indicated by arrows in the case where fixing portion 118b of hinge 118 is mounted on a side surface portion of through hole 117 formed in fourth panel 105C. In other drawings attached to this specification, to prevent the drawings from becoming complicated, fixing portions 118a and fixing portions 118b of the hinges are omitted. By using hinge 118 for fixing lid plate 119 to fourth panel 105C, in the case where lid plate 119 is opened for allowing a wind to pass through hole 117 and own weight of lid plate 119 can be ignored, lid plate 119 is directed in the direction where wind forces received by lid plate 119 from both surfaces are balanced. That is, lid plate 119 is directed in the direction parallel to the wind direction or in the direction that lid plate 119 makes wind flow along a surface of lid plate 119.

Figure 13A:
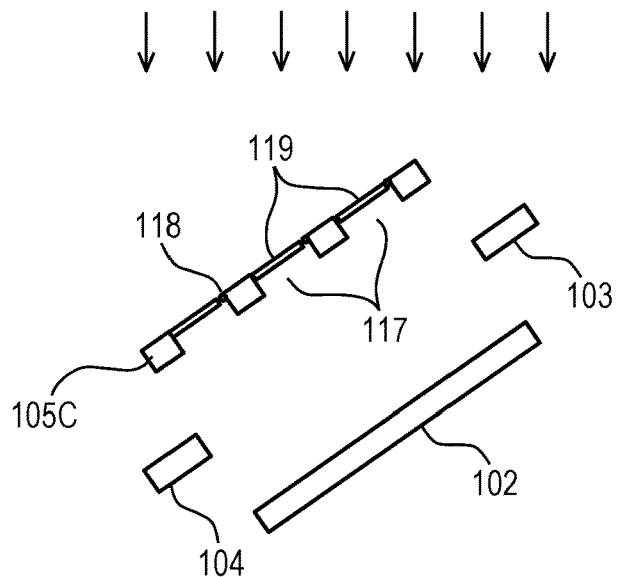
FIG. 13A is an explanatory view for describing the fourth panel of the solar panel unit of the third exemplary embodiment in a state where the fourth panel is disposed on a windward side, a wind incident angle is 45 degrees or less, and respective lid plates of the fourth panel close the through holes.
Figure 13B:
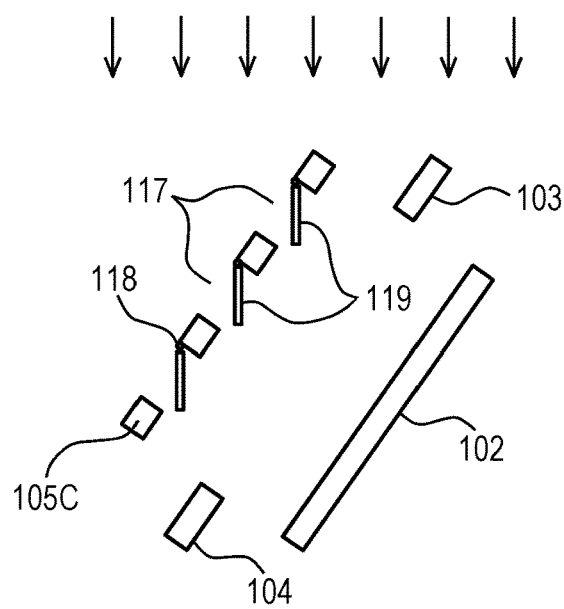
FIG. 13B is an explanatory view for describing the fourth panel of the solar panel unit of the third exemplary embodiment in a state where the fourth panel is disposed on a windward side, a wind incident angle is 45 degrees or more, and respective lid plates of the fourth panel are opened so that a wind passes through the through holes.

To explain the manner of operation and an action of fourth panel 105C having the above-mentioned structure against a wind, FIG. 13A, FIG. 13B, FIG. 13C and FIG. 13D show the cross section of fourth panel 105C and the correspondence with the wind direction. Assume that, as shown in FIG. 13A, when a wind blows to fourth panel 105C from a side where lid plates 119 are disposed and an intersecting angle between the normal direction of fourth panel 105C and the wind direction is 45 degrees or less, lid plates 119 are in a closed state. The panel structure has the left-and-right symmetrical structure and hence, the intersecting angle becomes an acute angle of 90 degrees or less. In this case, lid plates 119 close through holes 117 so that the panel unit has the three-stage structure constituted of first panel 102, second panel 103, third panel 104 and fourth panel 105C. As shown in FIG. 13B, when a wind blows to fourth panel 105C from a side where lid plates 119 are disposed, an intersecting angle between the normal direction of fourth panel 105C and the wind direction is 45 degrees or more, and a wind speed exceeds a predetermined value (15 m/s, for example) within a range where electric power is generated by a wind, lid plates 119 of fourth panel 105C are opened by being pushed by a wind pressure so that a wind passes through holes 117.

In this case, fourth panel 105C acts with respect to a wind as if fourth panel 105C is not present and hence, the panel unit has the two-stage structure constituted of first panel 102, second panel 103 and third panel 104 in appearance. Also in this case, since panel structure has the left-and-right symmetrical structure, an intersecting angle becomes an acute angle of 90 degrees or less.

Assume that, as shown in FIG. 13C, when a wind blows to the panels from a side where first panel 102 is disposed on a windward side and an intersecting angle between the normal direction of first panel 102 and the wind direction is 45 degrees or less, lid plates 119 of fourth panel 105C are in a closed state. The panel structure has the left-and-right symmetrical structure so that an intersecting angle is set to an acute angle of 90 degrees or less. In this case, lid plates 119 of fourth panel 105C close through holes 117 so that the panel unit has the three-stage structure constituted of first panel 102, second panel 103, third panel 104 and fourth panel 105C.

As shown in FIG. 13D, when a wind blows to the panels from a side where first panel 102 is disposed on a windward side, an intersecting angle between the normal direction of first panel 102 and the wind direction is 45 degrees or more, and a wind speed exceeds a predetermined value (15 m/s, for example) within a range where electric power is generated by a wind, lid plates 119 of fourth panel 105C are opened by being pushed by a wind pressure so that wind passes through holes 117. In this case, fourth panel 105C acts with respect to wind as if fourth panel 105C is not present and hence, the panel unit has two-stage structure constituted of first panel 102, second panel 103 and third panel 104 in appearance. The panel structure has the left-and-right symmetrical structure so that an intersecting angle is set to an acute angle of 90 degrees or less.

In this manner, by opening or closing lid plates 119 of fourth panel 105C depending on the wind direction and a wind speed, as can be understood from the result shown in FIG. 7, a wind load received by the panels as a whole becomes smaller than 80% of a maximum wind load received by the panels as a whole in the two-stage structure. A wind load received by one flat plate having a square shape of 1 cm×1 cm is 307 N when a wind speed is 20 m/s and hence, a maximum load received by fourth panel 105C is smaller than 75% of a maximum wind load received by fourth panel 105C. The wind direction and the wind speed can be obtained by an anemometer. Further, the directions of the panels are always controlled so as to direct the sun. Accordingly, an incident angle of a wind with respect to the panel can be calculated based on the wind direction and the panel direction.

Figure 14:
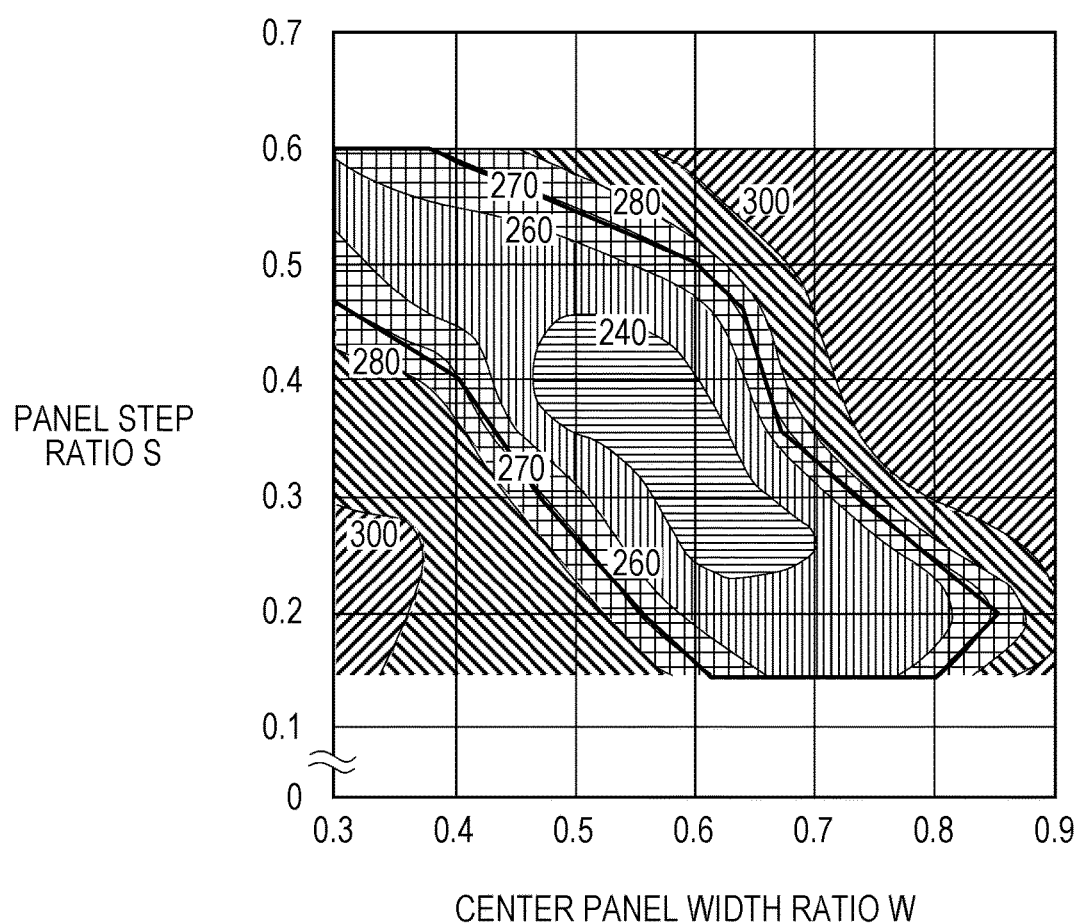
FIG. 14 is a graph showing the relationship between a maximum wind load received by the solar panel unit of the third exemplary embodiment having the three-stage panel structure at a wind speed of 20 m/s, a center panel width ratio and a panel step ratio in a state where through holes formed in the fourth panel are closed when a wind incident angle with respect to a panel is 45 degrees or less, and a wind passes through the through holes formed in the fourth panel when the wind incident angle is 45 degrees or more.

A wind load received by the panel is reduced for preventing the breaking of the panel and for reducing load of operating motors 113, 114. In the same system, a wind load is proportional to a square of a wind speed. In view of the above, when a wind speed reaches a predetermined wind speed with the solar panel in an operation state where the solar panel is not retracted, an open/close operation of lid plates 119 for opening or closing through holes 117 formed in the fourth panel is determined based on a wind incident angle with respect to the panel, and the open/close operation is performed when the conditions are satisfied. When a wind speed is set to 20 m/s, a width of the center panel and a size of the step formed between the panels are changed, and wind is made to pass through the fourth panel depending on the wind direction as described above, the distribution of a maximum wind load shown in FIG. 14 is obtained. A center panel width ratio W which is a ratio of a width of first panel 102 to a total panel unit width ranging from an edge of second panel 103 to an edge of third panel 104 is taken on an axis of abscissas, and a panel step ratio S which is a ratio of a step formed between the first panel and the second panel or the third panel, or a step formed between the fourth panel and the second panel or the third panel to the above-mentioned total panel unit width is taken on an axis of ordinates.

As can be understood from FIG. 14, the panel constitution by which a wind load of 270 N or less which is approximately 90% of a wind load received by one flat plate is obtained even when a wind blows to the panels from any side is the panel structure which satisfies the following conditions.

$0.68-0.70W \leq S$ at $0.30 \leq W \leq 0.40$
$0.97-1.43W \leq S$ at $0.40 \leq W \leq 0.47$
$0.89-1.25W \leq S$ at $0.47 \leq W \leq 0.55$
$0.66-0.83W \leq S$ at $0.55 \leq W \leq 0.61$
$0.15 \leq S$ at $0.61 \leq W \leq 0.80$
$-0.65+1.00W \leq S$ at $0.80 \leq W \leq 0.85$ and $S \leq 0.60$ at $0.30 \leq W \leq 0.38$
$S \leq 0.77-0.45W$ at $0.38 \leq W \leq 0.60$
$S \leq 1.10-1.00W$ at $0.60 \leq W \leq 0.64$
$S \leq 2.59-3.33W$ at $0.64 \leq W \leq 0.67$
$S \leq 0.96-0.89W$ at $0.67 \leq W \leq 0.85$ The panel constitution by which a wind load of 240 N or less which is approximately 80% of a wind bad received by one flat plate is obtained is the panel structure which satisfies the following conditions.

$1.78-3.00W \leq S$ at $0.46 \leq W \leq 0.47$
$0.64-0.57W \leq S$ at $0.47 \leq W \leq 0.54$
$1.05-1.33W \leq S$ at $0.54 \leq W \leq 0.60$
$0.65-0.67W \leq S$ at $0.60 \leq W \leq 0.63$
$0.10+0.20W \leq S$ at $0.63 \leq W \leq 0.68$
$-0.10+0.50W \leq S$ at $0.68 \leq W \leq 0.70$ and $S \leq 1.78+3.00W$ at $0.46 \leq W \leq 0.47$
$S \leq -0.04+1.00W$ at $0.47 \leq W \leq 0.50$
$S \leq 0.56-0.20W$ at $0.50 \leq W \leq 0.55$
$S \leq 1.00-1.00W$ at $0.55 \leq W \leq 0.60$
$S \leq 1.40-1.67W$ at $0.60 \leq W \leq 0.66$
$S \leq 0.80-0.75W$ at $0.66 \leq W \leq 0.70$ In the numerical analysis, a wind bad is obtained with respect to a center panel width ratio W and a panel step ratio S under conditions where a total panel unit width is set to 1 m and a length of each panel is set to 1 m. In fluid dynamics, the proportional relationship is established between a relative shape of a panel and a wind load received by the panel as a whole even when an actual length or an actual width is changed. Accordingly, when the panel structure has the relationship which falls within the above-mentioned range, the panel structure receives a wind load which is 90% or less or 80% or less of a wind load received by one flat plate.

In this embodiment, a wind passes through fourth panel 105C depending on a wind speed when an intersecting angle made between the normal direction of first panel 102 or fourth panel 105C and the wind direction is 45 degrees or more. However, a wind may pass through fourth panel 105C depending on a wind speed when the intersecting angle is 45 degrees or more and 75 degrees or less. Also in this embodiment, the panel structure has the left-and-right symmetrical structure so that an intersecting angle is set to an acute angle of 90 degrees or less. This is because when an intersecting angle between the normal direction of first panel 102 or fourth panel 105C and the wind direction is 75 degrees or more, a wind load received by the panel does not exceed maximum values of wind load received by the panel at other angles.

Figure 15A:
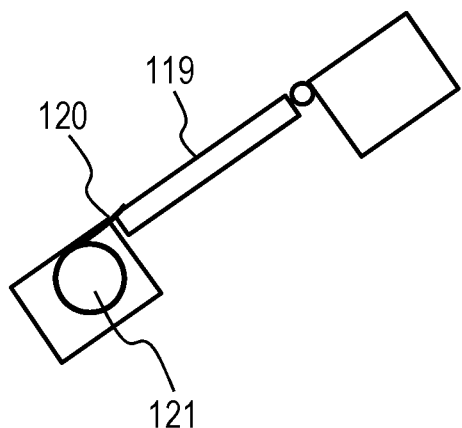
FIG. 15A is a schematic view of an opening/closing mechanism for opening/closing the through hole formed in the fourth panel of the solar panel unit of the third exemplary embodiment, and is also a cross-sectional view showing a state where the through hole is closed.
Figure 15B:
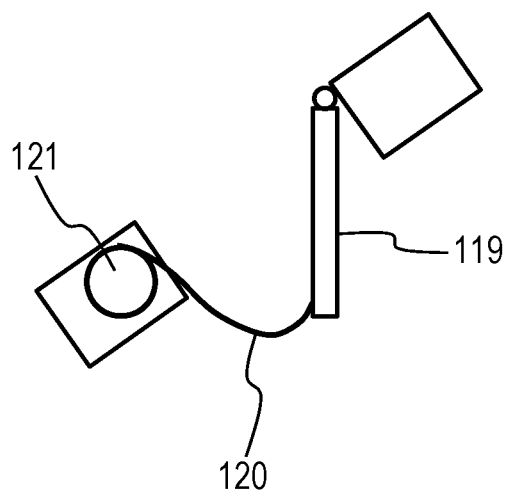
FIG. 15B is a schematic view of the opening/closing mechanism for opening/closing the through hole formed in the fourth panel of the solar panel unit of the third exemplary embodiment, and is also a cross-sectional view showing a state where the through hole is opened.

As an example of the structure where a wind passes through fourth panel 105C, the structure is described where the direction of lid plate 119 is changed in accordance with the wind direction using hinge 118. Here, one example of a method of opening/closing lid plate 119 is described. FIG. 15A shows a state where the lid plate is in a closed state, and FIG. 15B shows a state where the lid plate is in an open state. Wire 120 is mounted on a lid plate, and wire 120 is wound around winding cylinder 121 mounted on a portion of fourth panel 105C around through hole 117. When winding cylinder 121 is rotated, wire 120 is further wound so that lid plate 119 is closed as shown in FIG. 15A, while when winding cylinder 121 is rotated in the reverse direction so as to release wire 120, lid plate 119 is opened as shown in FIG. 15B and flaps in accordance with the wind direction using hinge 118 as a fulcrum such that a wind load is reduced. Although not shown in the drawing, winding cylinder 121 is rotated using a rotation driving system such as a motor. One rotation driving system may be provided for driving individual lid plate 119, or power generated by one rotation driving system may be distributed for driving respective lid plates 119.

Figure 16A:
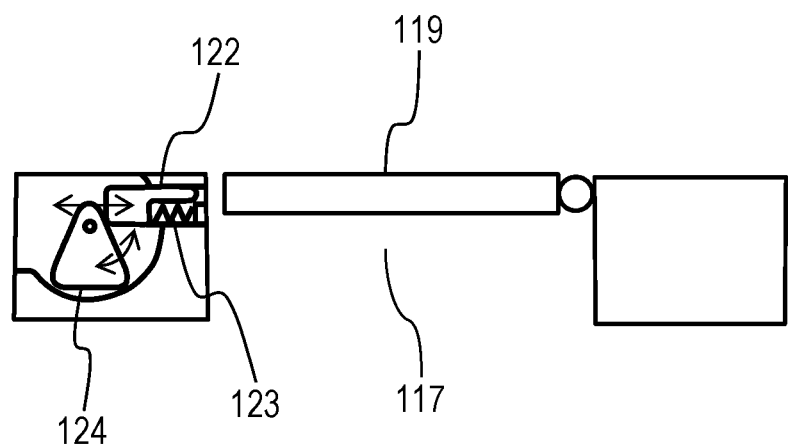
FIG. 16A is a schematic view of a fixing mechanism for fixing a lid plate which closes the through hole formed in the fourth panel of the solar panel unit of the third exemplary embodiment, and is also a cross-sectional view showing a state where fixing of the lid plate is released.
Figure 16B:
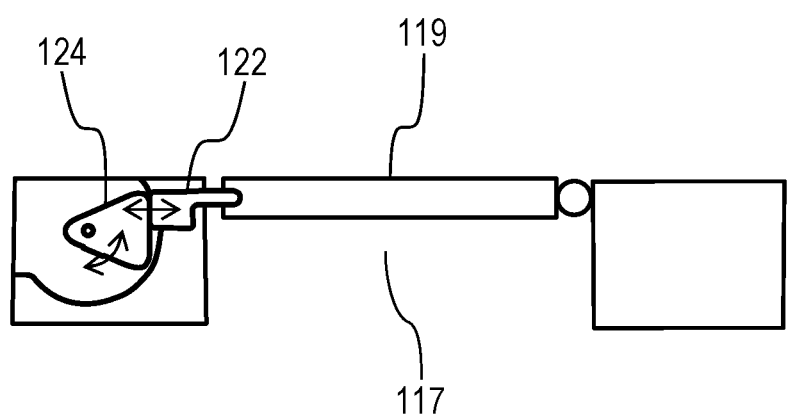
FIG. 16B is a schematic view of the fixing mechanism for fixing the lid plate which closes the through hole formed in the fourth panel of the solar panel unit of the third exemplary embodiment, and is also a cross-sectional view showing a state where the lid plate is fixed.

Only winding wire 120 is not sufficient for maintaining lid plate 119 in a closed state. To maintain lid plate 119 in a closed state, it is necessary to maintain wire 120 in a pulled state. As a method of maintaining such a state without using power from the rotation driving system, a method of fixing the wire is considered. FIG. 16A and FIG. 16B show one example of a method of fixing lid plate 119. FIG. 16A shows a state where the holding of lid plate 119 is released, and FIG. 16B shows a state where lid plate 119 is held. The mechanism is housed in a portion of fourth panel 105C around through hole 117. A recessed portion is formed on a side surface of lid plate 119, and pin 122 which is inserted into the recessed portion is provided. Usually, pin 122 is housed in fourth panel 105C by spring 123, and is pushed out due to the rotation of cam 124. Although not shown in the drawing, cam 124 is rotated by a rotation driving system such as a motor. The rotation of cam 124 and the above-mentioned rotation of winding cylinder 121 can be controlled by the same driving system.

Even when the direction of lid plate 119 is not changed in accordance with a change in the wind direction, an advantageous effect of reducing a wind bad described in the second exemplary embodiment of the present disclosure is not impaired.

This disclosure is not limited to the exemplary embodiments, and can be carried out in various modes.

For example, in the first to third exemplary embodiments of this disclosure, it is assumed that a width and a length of fourth panel 105 are equal to a width and a length of first panel 102. However, a role of fourth panel 105 is a wind-break so that it does not matter whether or not sun light is incident on fourth panel 105. In view of the above, fourth panel 105 may have a width and a length slightly larger than or slightly smaller than a width and a length of the first panel 102. From an economical point of view and from a viewpoint of acquiring favorable characteristics, fourth panel 105 may have the same width or length as first panel 102, or may have a smaller width or length than first panel 102 by approximately 10%.

In the first to third exemplary embodiments of this disclosure, the step formed between first panel 102 and second panel 103 and the step formed between first panel 102 and third panel 104 have the same size. However, the step formed between first panel 102 and second panel 103 and the step formed between first panel 102 and third panel 104 may have different sizes. Alternatively, the step S1 formed between first panel 102 and second panel 103 and step S2 formed between second panel 103 and fourth panel 105 may have different sizes. From a viewpoint of suppressing a moment of rotation generated due to the asymmetrical structure, a difference in size between two steps may be suppressed to 10% or less.

Arbitrary exemplary embodiments and modifications among the above-mentioned various exemplary embodiments and modifications may be suitably combined with each other. In such a case, the advantageous effects which the respective exemplary embodiments and respective modifications possess can be also acquired.

To recapitulate the above, this disclosure is directed to the solar panel unit which includes: the first panel provided with a module having the photovoltaic element on the front surface of the first panel; and the second panel provided with the module having the photovoltaic element on the front surface of the second panel, the second panel being disposed on one side of the first panel in a width direction, and also being disposed at a position behind the first panel by one step in a direction orthogonal to the front surface of the first panel as viewed from the front surface side of the first panel. The second panel and the first panel have the same length, and the front surface of the second panel and the front surface of the first panel are parallel to each other.

The solar panel unit further includes the third panel provided with the module having a photovoltaic element on a front surface of the third panel, the third panel being disposed on the other side opposite to one side of the first panel in the width direction, and also being disposed at a position behind the first panel by one step in the direction orthogonal to the front surface of the second panel as viewed from a front surface side of the first panel. The third panel and the first panel have the same length, the third panel and the second panel have the same width, and the front surface of the third panel and the front surface of the first panel are parallel to each other.

The solar panel unit further includes the fourth panel disposed at a position symmetrical with the first panel with respect to the second panel and the third panel in the direction orthogonal to the front surface of the first panel. The fourth panel is not provided with the module having a photovoltaic element on the front surface of the fourth panel, the length of the fourth panel is equal to the length of the first panel, the width of the fourth panel is equal to the width of the first panel, and the front surface of the fourth panel is parallel to the front surface of the first panel.

In the solar panel unit and the solar power generation apparatus according to this disclosure, an influence of wind on the solar panel unit and the apparatus can be reduced even when a wind blows from any side including a front side and a rear side of the unit. Accordingly, the unit and the apparatus of this disclosure can be effectively useful as a power generation facility which makes use of sun light which is natural energy.

What is claimed is:

1. A solar panel unit comprising:
   a first panel provided with a module having a photovoltaic element on a front surface of the first panel;
   a second panel provided with a module having a photovoltaic element on a front surface of the second panel, the second panel disposed on a first side of the first panel in a width direction, the second panel disposed at a position behind the first panel in a direction orthogonal to the front surface of the first panel with a predetermined distance therebetween as viewed from a front surface side of the first panel;
   a third panel provided with a module having a photovoltaic element on a front surface of the third panel, the third panel disposed on a second side of the first panel opposite to the first side of the first panel in the width direction, the third panel disposed at a position behind the first panel in the direction orthogonal to the front surface of the second panel with a predetermined distance therebetween as viewed from the front surface side of the first panel; and
   a fourth panel disposed at a position located in the direction orthogonal to the front surface of the first panel,
   wherein a length of the second panel is equal to a length of the first panel, and the front surface of the second panel is parallel to the front surface of the first panel,
   wherein a length of the third panel is equal to the length of the first panel, a width of the third panel is equal to a width of the second panel, and the front surface of the third panel is parallel to the front surface of the first panel,
   wherein the fourth panel is not provided with a module having a photovoltaic element on a front surface of the fourth panel, a length of the fourth panel is equal to the length of the first panel, a width of the fourth panel is equal to a width of the first panel, and the front surface of the fourth panel is parallel to the front surface of the first panel,
   wherein a first gap is formed between the first panel and the second panel, a second gap is formed between the first panel and the third panel, a third gap is formed between the first panel and the fourth panel, a fourth gap is formed between the second panel and the third panel, and the fourth panel does not directly contact the second panel or the third panel,
   wherein the second panel, the third panel, and the fourth panel are arranged such that, if the front surface of the second panel, the front surface of the third panel, and the front surface of the fourth panel are arranged in an imaginary plane by only vertical movement without moving any of the second panel, the third panel, or the fourth panel horizontally, the front surface of the fourth panel does not overlap with the front surface of the second panel or the front surface of the third panel,
   wherein a size of the first gap is smaller than a size of the third gap, and
   wherein a size of the second gap is smaller than the size of the third gap wherein the fourth panel comprises a through hole that extends in a direction orthogonal to the front surface of the first panel.

2. The solar panel unit according to claim 1, wherein a ratio of the width of the first panel to a total panel unit width is W, the total panel unit width being a sum of the width of the first panel, the width of the second panel, and the width of the third panel, and a ratio of a step between the front surface of the first panel and the front surface of the second panel to the total panel unit width is S, the step between the front surface of the first panel and the front surface of the second panel being equal to the step between the front surface of the second panel and the front surface of the fourth panel, the following relationship is established;

0.90-1.00 W≤S at 0.30≤W≤0.40
1.02-1.30 W≤S at 0.40≤W≤0.63
0.52-0.50≤W S at 0.63≤W≤0.73
0.15≤S at 0.73≤W≤0.90.

3. The solar panel unit according to claim 1, wherein the fourth panel has:
a lid capable of opening and closing the through hole; and
an opening/closing mechanism for opening and closing the lid.

4. The solar panel unit according to claim 3, wherein the fourth panel is configured such that an outer surface of the lid is disposed on the same plane as an outer surface of the fourth panel in a state where the lid closes the through hole.

5. The solar panel unit according to claim 3, wherein the fourth panel is configured such that the lid is positioned parallel to the wind direction in a state where the lid opens the through hole.

6. The solar panel unit according to claim 1, wherein a thickness of the fourth panel is set smaller than thicknesses of the first panel, the second panel and the third panel, and a weight of the fourth panel is set smaller than a weight of the first panel.

7. The solar panel unit according to claim 1, wherein the module of each of the first panel, the second panel, and the third panel further includes a light-collecting optical member which collects sun light on the photovoltaic element.

8. The solar panel unit according to claim 1, wherein the fourth panel has a cutaway portion into or out of which a support strut supporting the first panel to fourth panel extends.

9. A solar power generation apparatus comprising:
the solar panel unit according to claim 1;
a support strut supporting the first panel, the second panel, the third panel, and the fourth panel of the solar panel unit; and
a two-axis rotation mechanism disposed between the support strut and the panel, the two-axis rotation mechanism being configured to move the solar panel unit in an elevation angle direction and in an azimuth direction independently from each other,
wherein a center of gravity of the solar panel unit and a center of a rotation axis of the two-axis rotation mechanism agree with each other.

10. The solar power generation apparatus according to claim 9, wherein the two-axis rotation mechanism is provided in a region surrounded by the first panel, the second panel, the third panel, and the fourth panel of the solar panel unit.

11. A solar panel unit comprising:
a first panel having a first surface, a second surface opposite to the first surface, and a first photovoltaic module that receives sun light through the first surface;
a second panel having a third surface, a fourth surface opposite to the third surface, and a second photovoltaic module that receives sun light through the third surface;
a third panel having a fifth surface, a sixth surface opposite to the fifth surface, and a third photovoltaic module that receives sun light through the fifth surface; and
a fourth panel having a seventh surface and an eighth surface opposite to the seventh surface,
wherein the fourth surface and the sixth surface are present on the same imaginary plane,
wherein the second surface, the eighth surface, and the imaginary plane are parallel to each other,
wherein a first distance between the second surface and the imaginary plane is smaller than a second distance between the second surface and the eighth surface,
wherein, when the second surface is moved vertically onto the imaginary plane without being moved horizontally, the second surface does not overlap with the fourth surface and the sixth surface,
wherein, when the seventh surface is vertically moved onto the imaginary plane without being moved horizontally, the seventh surface does not overlap with the fourth surface and the sixth surface,
wherein a length of the first panel, a length of the second panel, a length of the third panel, and a length of the fourth panel are equal,
wherein a width of the first panel and a width of the fourth panel are equal,
wherein a width of the second panel and a width of the third panel are equal,
wherein the first panel is directly connected to a connecting portion connected to a support portion,
wherein the second panel, the third panel and the fourth panel are not directly connected to the connecting portion,
wherein the first panel, the second panel, the third panel and the fourth panel are connected to each other,
wherein a thickness of the second panel and a thickness of the third panel are smaller than the first distance,
wherein a thickness of the fourth panel is smaller than a distance between the imaginary plane and the eighth surface, and
wherein a first gap is formed between the first panel and the second panel, a second gap is formed between the first panel and the third panel, a third gap is formed between the first panel and the fourth panel, a fourth gap is formed between the second panel and the third panel, and the fourth panel does not directly contact the second panel or the third panel wherein the fourth panel comprises a through hole that extends in a direction orthogonal to the first surface of the first panel.

12. The solar panel unit according to claim 11, wherein the fourth panel is not provided with a photovoltaic module.

* * * * *